(12) United States Patent
Olson et al.

(10) Patent No.: US 12,424,527 B2
(45) Date of Patent: Sep. 23, 2025

(54) MULTI-CHIP OR MULTI-CHIPLET FAN-OUT DEVICE FOR LAMINATE AND LEADFRAME PACKAGES

(71) Applicant: Deca Technologies USA, Inc., Tempe, AZ (US)

(72) Inventors: Timothy L. Olson, Phoenix, AZ (US); Paul R. Hoffman, San Diego, CA (US); Clifford Sandstrom, Richfield, MN (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/742,517

(22) Filed: Jun. 13, 2024

(65) Prior Publication Data

US 2024/0421052 A1  Dec. 19, 2024

Related U.S. Application Data

(63) Continuation of application No. 18/740,513, filed on Jun. 12, 2024.
(Continued)

(51) Int. Cl.
*H01L 23/495* (2006.01)
*H01L 23/00* (2006.01)
(Continued)

(52) U.S. Cl.
CPC .... *H01L 23/49575* (2013.01); *H01L 23/3735* (2013.01); *H01L 23/4951* (2013.01);
(Continued)

(58) Field of Classification Search
CPC ........... H01L 23/49575; H01L 23/4951; H01L 24/45; H01L 24/05; H01L 25/0652;
(Continued)

(56) References Cited

U.S. PATENT DOCUMENTS

| | | | |
|---|---|---|---|
| 8,896,109 B2 * | 11/2014 | Pagaila | H01L 25/0652 438/126 |
| 9,786,614 B2 * | 10/2017 | Chen | H01L 24/02 |

(Continued)

FOREIGN PATENT DOCUMENTS

| | | |
|---|---|---|
| CN | 207021261 | 2/2018 |
| TW | I787075 | 12/2022 |
| TW | 202310265 | 3/2023 |

*Primary Examiner* — Alonzo Chambliss
(74) *Attorney, Agent, or Firm* — Booth Udall, PLC; Kenneth C. Booth

(57) ABSTRACT

An electronic assembly component may comprise at least one fan-out device comprising a first encapsulant disposed around a memory device or function and a processor device or function, and a fan-out interconnect structure disposed over the first encapsulant and the at least one fan-out device. Input output pads may be disposed over the fan-out interconnect structure. A structural support may comprise electrical routing and structural support pads, the structural support further comprising at least one mounting site to which the at least one fan-out device is coupled. An electrical connector may be configured to electrically couple the input output pads of the at least one fan-out device to the structural support pads. A second encapsulant may be disposed over at least a portion of the at least one fan-out device and the structural support.

27 Claims, 12 Drawing Sheets

Related U.S. Application Data

(60) Provisional application No. 63/508,243, filed on Jun. 14, 2023.

(51) Int. Cl.
*H01L 23/373* (2006.01)
*H01L 25/065* (2023.01)

(52) U.S. Cl.
CPC .............. *H01L 24/05* (2013.01); *H01L 24/45* (2013.01); *H01L 24/97* (2013.01); *H01L 25/0652* (2013.01); *H01L 2224/05005* (2013.01); *H01L 2224/05009* (2013.01); *H01L 2224/05023* (2013.01); *H01L 2224/05025* (2013.01); *H01L 2224/45005* (2013.01); *H01L 2224/4502* (2013.01); *H01L 2224/97* (2013.01); *H01L 2924/01028* (2013.01); *H01L 2924/01029* (2013.01); *H01L 2924/1205* (2013.01); *H01L 2924/1206* (2013.01); *H01L 2924/1207* (2013.01); *H01L 2924/1431* (2013.01); *H01L 2924/1434* (2013.01); *H01L 2924/15172* (2013.01); *H01L 2924/15311* (2013.01)

(58) Field of Classification Search
CPC . H01L 23/31; H01L 23/538; H01L 2924/181; H01L 21/561; H01L 21/56; H01L 21/6835
See application file for complete search history.

(56) References Cited

U.S. PATENT DOCUMENTS

| | | | |
|---|---|---|---|
| 10,714,426 B2* | 7/2020 | Hsieh | H01L 21/4857 |
| 11,282,825 B2* | 3/2022 | Lin | H01L 25/18 |
| 11,296,062 B2* | 4/2022 | Yu | H01L 24/97 |
| 2012/0161279 A1* | 6/2012 | Lin | H01L 23/3128 |
| | | | 438/107 |
| 2013/0168849 A1 | 7/2013 | Scanlan | |
| 2013/0256861 A1* | 10/2013 | Do | H01L 23/28 |
| | | | 257/676 |
| 2014/0124941 A1* | 5/2014 | Sakamoto | H01L 23/3114 |
| | | | 257/773 |
| 2015/0021754 A1* | 1/2015 | Lin | H01L 23/552 |
| | | | 438/122 |
| 2015/0084206 A1* | 3/2015 | Lin | H01L 23/5389 |
| | | | 257/774 |
| 2017/0330858 A1 | 11/2017 | Lee | |
| 2019/0237375 A1 | 8/2019 | Jung | |
| 2021/0134724 A1 | 5/2021 | Rubin | |
| 2022/0173067 A1* | 6/2022 | Sandstrom | H01L 24/20 |
| 2024/0213135 A1* | 6/2024 | Olson | H01L 21/568 |

* cited by examiner

MULTI-CHIP OR MULTI-CHIPLET FAN-OUT DEVICE FOR LAMINATE AND LEADFRAME PACKAGES

CROSS-REFERENCE TO RELATED APPLICATIONS

This application is a continuation of U.S. patent application Ser. No. 18/740,513, entitled, "Multi-Chip or Multi-Chiplet Fan-Out Device for Laminate and Leadframe Packages" filed on Jun. 12, 2024, which application claims the benefit of U.S. Provisional Patent No. 63/508,243, entitled "Chiplet-based Fan-Out Wirebond or Flip Chip Assembly for Leadframe Packages" filed on Jun. 14, 2023, the entire disclosures of which are hereby incorporated herein by this reference.

TECHNICAL FIELD

This disclosure concerns multi-chip or multi-chiplet based laminate and leadframe fan-out assemblies and methods of forming the same.

BACKGROUND

Semiconductor devices, packages, substrates, and interposers are commonly found in modern electronic products. Production of semiconductor devices involves a multistep build-up of components. Conventional interconnect structures alternate dielectric and conductive layers. An opening, via, and capture pads, may be created to allow connectivity from one conductive layer to another between dielectric layers. Traditional chips, integrated circuits (ICs), or semiconductor die may comprise architecture that comprises multiple functions, including processing or a central processing unit (CPU), memory, and other functionality.

SUMMARY

An opportunity exists for improved semiconductor assemblies, including applications for semiconductor manufacturing. Accordingly, in an aspect of the disclosure, an electronic assembly component may comprise at least one fan-out device comprising a first encapsulant disposed around a memory device or function, and a processor device or function. The electronic assembly component may further comprise a fan-out interconnect structure which may be disposed over the first encapsulant and the at least one fan-out device. Input output pads may be disposed over the fan-out interconnect structure. The electronic assembly component may further comprise a structural support comprising electrical routing and structural support pads. The structural support may further comprise at least one mounting site to which the fan-out device may be coupled. The electronic assembly component may further comprise an electrical connector configured to electrically couple the input output pads of the at least one fan-out device to the structural support pads. A second encapsulant may be disposed over at least a portion of the fan-out device and the structural support.

In some embodiments, the electronic assembly component may further comprise a memory device or function comprising non-volatile memory (NVM), dynamic random-access memory (DRAM), static random-access memory (SRAM), or any other suitable type of memory) and a processor device or function comprising a microcontroller unit (MCU), a central processing unit (CPU), a graphics processing unit (GPU), a field programmable gate array (FPGA), an application-specific integrated circuit (ASIC), a digital signal processor (DSP), an application processor (AP), a neural processing unit (NPU), or a network processor, the at least one fan-out device comprising at least one additional component comprising one or more of an analog device, a passive device, a transistor, a diode, an RF device, a multiplier function, a clock, an artificial intelligence (AI) accelerator, another IP function, and a chiplet disposed at least partially within the first encapsulant. The fan-out interconnect structure of the fan-out device may be formed comprising a molded direct contact interconnect structure or a build-up interconnect structure comprising polyimide (PI).

The structural support of the electronic assembly component, comprising electrical routing and structural support pads, may comprise a leadframe, wherein the structural support pads of the leadframe are coupled to the input output pads of the at least one fan-out device. In further embodiments, the structural support of the electronic assembly component may comprise a laminate substrate, ceramic substrate, glass core substrate, or a printed circuit board (PCB) (hereinafter "laminate substrate or PCB"), wherein the structural support pads of the laminate substrate or PCB are coupled to the input output pads of the at least one fan-out device. The structural support pads of the electronic assembly component may be coupled to the input output pads of the at least one fan-out device with wire bonds as the electrical connector, or flip chip bumps as the electrical connector.

The electronic assembly component may further comprise external or package input output structures comprising one or more lands, balls, pads, leads (such as quad flat package (QFP) leads), pins, and external interconnects. In some embodiments, the electronic assembly component comprises a quad flat no-lead (QFN) package, dual flat no-lead (DFN) package, a small outline no-lead (SON) package, a small outline integrated circuit (SOIC), a small outline package (SOP), a shrink small outline package (SSOP), a thin small outline package (TSOP), a thin shrink small outline package (TSSOP), a quad flat package (QFP), thin quad flat pack (TQFP), plastic leaded chip carrier (PLCC), small outline J-lead package (SOJ), plastic dual-in-line package (PDIP), a ball grid array (BGA), a plastic BGA (PBGA), a fine pitch BGA (FBGA), a land grid array (LGA), a system in package (SIP), or a multi-chip module (MCM).

According to an aspect of the disclosure, at least a portion of the fan-out interconnect structure of the electronic assembly component may comprise unit specific patterning such that a misalignment between a via or conductive stump for RDL of the fan-out device and the input output pads is less than a misalignment between an edge of the at least one fan-out device and the conductive studs of each of the memory device or function and the processor device or function. In another aspect, the fan-out interconnect structure may be disposed over the first encapsulant and coupled to conductive studs extending through the first encapsulant, the conductive studs being coupled to the memory device or function and the processor device or function.

Additional embodiments of the electronic assembly component may comprise a fan-out device comprising input output pads and a structural support comprising electrical routing and structural support pads. The structural support may further comprise at least one mounting site to which the fan-out device is coupled. The electronic assembly component may further comprise an electrical connector configured to electrically couple the input output pads of the fan-out device to the structural support pads. An encapsulant may be disposed over at least a portion of the fan-out device and the structural support.

The electronic assembly component may further comprise external or package input output structures comprising one or more lands, balls, pads, leads, pins, and external interconnects. The electronic assembly component may comprise a QFN package, DFN package, a SON package, a SOIC, a SOP, a SSOP, a TSOP, a TSSOP, a QFP, a PLCC, TQFP, a SOJ, a PDIP, a PBGA, FBGA, a LGA, a SIP, or a MCM.

In further embodiments, the fan-out device may comprise a first encapsulant disposed around a memory device or function, a processor device or function, and at least one additional component comprising one or more of an analog device, a passive device, a power transistor, an RF device, a multiplier function, a clock, an AI accelerator, another IP package, and a chiplet disposed at least partially within the first encapsulant.

The electronic assembly component may comprise a fan-out interconnect structure wherein at least a portion of the fan-out interconnect structure may be disposed over the fan-out device and the fan-out device may comprise unit specific patterning such that a misalignment between an edge of the fan-out device and the input output pads is less than a misalignment between an edge of the fan-out device and an edge of each of the memory device or function, the processor device or function, and the analog device. The fan-out interconnect structure may be disposed over the encapsulant and coupled to conductive studs extending through the encapsulant, and the conductive studs may be coupled to the memory device or function and the processor device or function.

In some embodiments, the electronic assembly component may comprise a conductive heatsink, flag, or lid. In other embodiments, the electronic assembly component may include a fan-out device which may be formed comprising a molded direct contact interconnect structure or a build-up interconnect structure comprising polyimide (PI).

According to an aspect of the disclosure, the electronic assembly component may comprise a structural support comprising electrical routing and structural support pads, the structural support may comprise a leadframe, wherein the structural support pads of the leadframe may be coupled to the input output pads of the fan-out device. In other embodiments, the structural support may comprise a laminate substrate or a PCB, wherein the structural support pads of the laminate substrate or PCB may be coupled to the input output pads of the fan-out device. The structural support pads of the electronic assembly component may be coupled to the input output pads of the fan-out device with wire bonds as the electrical connector. In further embodiments, the structural support pads of the electronic assembly component may be coupled to the input output pads of the fan-out device with flip chip bumps as the electrical connector.

According to an aspect of the disclosure a method of making at least one electronic assembly component may comprise receiving a plurality of chiplet components from different sources. The plurality of chiplet components may comprise at least one memory device or function and at least one processor device or function. A reconstituted panel may be formed comprising a plurality of fan-out devices. The plurality of fan-out devices may be formed by providing a temporary carrier, forming a repeating array of the plurality of chiplet components over the temporary carrier, disposing a first encapsulant over the temporary carrier and over and around the repeating array of the plurality of chiplet components, forming a fan-out interconnect structure over the repeating array of the plurality of chiplet components and the first encapsulant and, interconnecting the plurality of chiplet components to form a plurality of fan-out devices on the reconstituted panel. Input output pads may be formed over the fan-out interconnect structure and coupled thereto for each of the plurality of fan-out devices. The reconstituted panel may be singulated to form the plurality of fan-out devices comprising input output pads. A structural support comprising electrical routing may be provided, comprising structural support pads and a plurality of mounting sites. The plurality of fan-out devices may be mounted to the plurality of mounting sites on the structural support. A plurality of electrical connectors configured to electrically couple the input output pads of the plurality of fan-out devices to the structural support pads may be provided. Each of the structural support pads may be coupled with each of the input output pads of the plurality of fan-out devices may be coupled with the plurality of electrical connectors. A second encapsulant may be disposed over or contact the plurality of fan-out devices and the structural support. The plurality of fan-out devices and the structural support may be singulated to form the at least one electronic assembly component.

In some embodiments the at least one memory device or function may comprise NVM, DRAM, or SRAM, and the at least one processor device or function comprises a MCU, a CPU, a GPU, a FPGA, or an ASIC, a DSP, an AP, a NPU, or a network processor. The at least one memory device or function, the at least one processor device or function, and at least one additional component disposing, at least partially within the first encapsulant of the fan-out device. The at least one additional component may comprise one or more of an analog device, a passive device, a transistor, a diode, an RF device, a multiplier function, a clock, an AI accelerator, another IP function, and a chiplet. The fan-out device may be formed comprising a molded direct contact interconnect structure or a build-up interconnect structure comprising a dielectric different than the encapsulant, such as a polymer or PI. The structural support comprising electrical routing and structural support pads, further comprises providing the structural support as a leadframe and coupling the structural support pads of the leadframe to the input output pads of the fan-out device. Alternatively, the structural support comprising electrical routing and structural support pads may further comprise providing the structural support as a laminate substrate, ceramic substrate, glass core substrate, or a printed circuit board (PCB) and coupling the structural support pads of the laminate substrate or PCB to the input output pads of the fan-out device. The structural support pads may be coupled to the input output pads of the fan-out device with wire bonds as the plurality of electrical connectors or flip chip bumps as the plurality of electrical connectors. The external or package input output structures may be formed comprising one or more lands, balls, pads, leads, pins, and external interconnects. The structural support pads may be coupled to the input output pads of the fan-out device with wire bonds as the plurality of electrical connectors, or flip chip bumps as the plurality of electrical connectors. The at least one electronic assembly component comprises a QFN package, DFN package, a SON package, a SOIC, a SOP, a SSOP, a TSOP, a TSSOP, a QFP, a PLCC, TQFP, a SOJ, a PDIP, a PBGA, FBGA, a LGA, a SIP, or a MCM. The fan-out interconnect structure may be disposed over the first encapsulant and coupled to conductive studs extending through the first encapsulant, and the conductive studs may be coupled to the at least one memory device or function and the at least one processor device or function.

The fan-out interconnect structure may be disposed over the first encapsulant and coupled to the at least one memory device or function and the at least one processor device or function without conductive studs extending through the first encapsulant. The fan-out interconnect structure may be formed with unit specific patterning over the plurality of chiplet components to account for an actual position of the plurality of chiplet components within the reconstituted panel.

According to an aspect of the disclosure a method of making an electronic assembly component may comprise providing a fan-out device comprising input output pads; providing a structural support comprising electrical routing and structural support pads, the structural support further comprising at least one mounting site configured to couple with the fan-out device; mounting the fan-out device to the at least one mounting site on the structural support; providing an electrical connector configured to electrically couple the input output pads of the fan-out device to the structural support pads; coupling, with the electrical connector, the structural support pads with the input output pads of the fan-out device; and disposing an encapsulant over or contacting at least a portion of the fan-out device and the structural support. The electronic assembly component may comprise a QFN package, DFN package, a SON package, a SOIC, a SOP, a SSOP, a TSOP, a TSSOP, a QFP, a PLCC, TQFP, a SOJ, a PDIP, a PBGA, FBGA, a LGA, a SIP, or a MCM. A memory device or function and a processor device or function may be disposed at least partially within a first encapsulant of the fan-out device. At least one additional component comprising one or more of analog device, a passive device, a transistor, a diode, an RF device, a multiplier function, a clock, an artificial intelligence (AI) accelerator, another IP function, and a chiplet may be disposed at least partially within the first encapsulant. At least a portion of a fan-out interconnect structure may be disposed over the fan-out device and the fan-out device comprises unit specific patterning such that a misalignment between a via or conductive stump for an RDL of the fan-out device and the input output pads is less than a misalignment between an edge of the at least one fan-out device and the conductive studs of one or more of the memory device or function and the processor device or function. A fan-out interconnect structure may be disposed over the first encapsulant; and coupled to conductive studs extending through the first encapsulant, the conductive studs being further coupled to the memory device or function and the processor device or function. A fan-out interconnect structure may be disposed over the first encapsulant; and the fan-out interconnect structure may be coupled to the memory device or function and the processor device or function without conductive studs extending through the first encapsulant. The electronic assembly component may comprise a conductive heatsink, flag, or lid. The fan-out device may be formed comprising a molded direct contact interconnect structure or comprising a build-up interconnect structure comprising a polymer, such as PI. Providing the structural support comprising electrical routing and structural support pads may further comprise: providing the structural support as a leadframe; and coupling the structural support pads of the leadframe to the input output pads of the fan-out device; or providing the structural support as a laminate substrate, ceramic substrate, glass core substrate, or a printed circuit board (PCB); and coupling the structural support pads of the laminate substrate or PCB to the input output pads of the fan-out device. The method may further comprise coupling the structural support pads to the input output pads of the fan-out device with wire bonds as the electrical connector; or coupling the structural support pads to the input output pads of the fan-out device with flip chip bumps as the electrical connector. External or package input output structures may be formed comprising one or more lands, balls, pads, leads, pins, and external interconnects.

In some embodiments the structural support comprises a leadframe, which may be formed by depressing a portion of the leadframe to form a depressed portion of the leadframe; and disposing the encapsulant over the fan-out device and around the depressed portion of the leadframe to form one or more exposed pads that are exposed with respect to the encapsulant at an exterior of the electronic assembly component.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

Implementations will hereinafter be described in conjunction with the appended and/or included drawings, where like designations denote like elements.

DETAILED DESCRIPTION

Figure 1A:
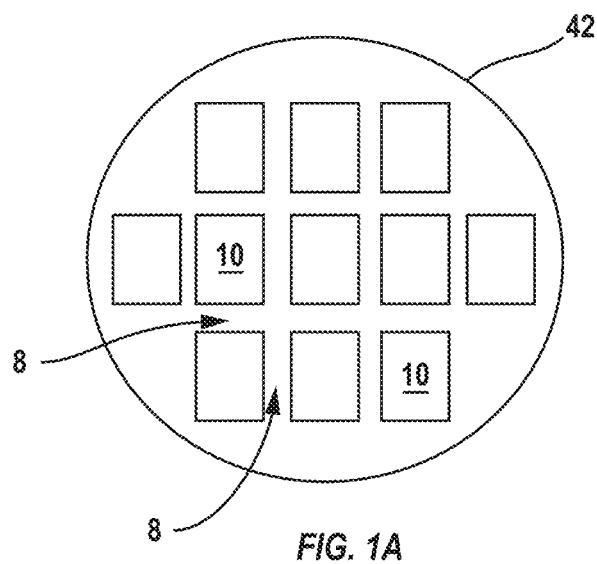
FIG. 1A illustrates an embodiment of a memory device or function.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the figures are illustrative representations and are not necessarily drawn to scale.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

The disclosure relates to at least one package or electronic assembly component made by the methods disclosed herein. In some embodiments, the at least one package or electronic assembly component comprises a comprise a QFN package, DFN package, a SON package, a SOIC, a SOP, a SSOP, a TSOP, a TSSOP, a QFP, a PLCC, TQFP, a SOJ, a PDIP, a PBGA, FBGA, a LGA, a SIP, or a MCM.

SSOP, TSSOP and TSOP packages are surface mounted interconnect packages that are smaller than conventional interconnect packages. These constructs typically comprise a metal leadframe. SSOPs, TSSOPs and TSOPs are rectangular surface mount packages that typically have gull-wing leads.

QFPs are surface-mounted integrated circuit packages having "gull wing" leads extending from all four sides. PLCCs are surface mount chip packages in plastic with leads on all four sides. PLCC leads have a "J" shape. QFPs and TQFPs are surface mounted chips with "gull wings" extending from four sides with the TQFP being thinner than a QFP package.

SOJs are small rectangular surface mount plastic molded packages with J-formed leads. DFNs are small square or rectangular surface mount packages without leads. SONs are small outline non-leaded plastic encapsulated packages with a copper leadframe.

Additionally, further disclosed herein are electronic packages or electronic assemblies which may comprise any desirable package having a laminate substrate, such as a ball grid array (BGA) package and related variations, a chip scale package (CSP) and related variations, and the like, as is known in the art.

Some electronic assemblies comprise at least one fan-out device comprising a first encapsulant disposed around a memory device or function and a processor device or function. A fan-out interconnect structure may be disposed over the first encapsulant and the at least one fan-out device, and input output pads may be disposed over the fan-out interconnect structure. The electronic assembly component may further comprise a structural support, comprising electrical routing and structural support pads. The structural support may further comprise at least one mounting site to which the at least one fan-out device may be coupled. The electronic assembly component may further comprise an electrical connector configured to electrically couple the input output pads of the at least one fan-out device to the structural support pads. A second encapsulant may be disposed over at least a portion of the at least one fan-out device and the structural support.

In an embodiment, the structural support 100 may comprise a leadframe 526, where in these embodiments the structural support pads 104 comprise bond leads 528 as part of the leadframe which are coupled to the input output pads 48 of the at least one fan-out device 40.

In further embodiments, the structural support 100 having structural support pads 104, may comprise a laminate substrate 200 or a PCB, where the structural support pads 104 may comprise bond pads 206, which are coupled to the input output pads 48 of the at least one fan-out device 40. The laminate substrate 200 or PCB may comprise a plurality of insulating and conducting layers further including vias and/or plated through holes to allow interconnection between layers. The laminate substrate may be single sided, double sided or a multilayer substrate dependent upon routing requirements.

The encapsulant 70 may be disposed partially or totally over the fan-out device 40 and structural support 100, including when the encapsulant 70 comprises a mold compound that is disposed as part of a molding operation. In some instances a glob top may be used (in addition to, or instead of, some or all of the encapsulant 70) to protect one or more of the wirebonds, encapsulant, and components from one or more of environmental, physical, or chemical factors.

In some embodiments, the at least one electronic assembly component comprises a comprise a QFN package, DFN package, a SON package, a SOIC, a SOP, a SSOP, a TSOP, a TSSOP, a QFP, a PLCC, TQFP, a SOJ, a PDIP, a PBGA, FBGA, a LGA, a SIP, or a MCM.

Fan-out devices 40 may be formed by joining together a plurality of chips or chiplets 34. A chip refers to both a physical implementation and a functional implementation. In a physical sense, a chip may be one of a plurality of identical units that are formed on a semiconductor wafer and that becomes an individual, stand-alone component when it is singulated (e.g., by a dicing or other separation process) from the wafer or native wafer. In a further physical sense, a chip (also sometimes referred to as a die or semiconductor die) typically comprises a semiconductor substrate, active areas in the semiconductor substrate (e.g., diodes or transistors) and conductive interconnect wiring. Chips may also comprise passive elements such as resistors, capacitors, or inductors. In some cases, chips may have multiple integrated circuits formed on them comprising hundreds to billions of transistors, while in other cases a chip may comprise a single diode or a single transistor.

In a functional sense, a chip may be designed to perform a specific function or multiple functions. For a simple chip, such as a chip comprising a single transistor, the function it performs may be relatively simple—such as acting as a switch or as an amplifier. Some chips may be designed to perform a specific function or related functions—for example, a dynamic random access memory chip (DRAM) is designed to temporarily store program code, instructions, or data for a processor within a computer system. A processor chip may accept input data and process it per instructions it receives to provide output data. There are many types of processor chips including central processing units (CPUs) that are able to work on a wide range of data, a microcontroller unit (MCU) designed for a very specific processing task, a graphics processing unit (GPU) designed to work on graphics-related data, or an application processor (AP) designed for a specific application such as for a cell phone. In some systems multiple chips are required to make the system functional. In a simplified example a personal computer may require a CPU, DRAM, non-volatile memory (NVM), long term storage (e.g., a disk drive), wired and wireless connectivity chips, and a GPU. In some cases, there has been a desire to reduce the number of chips in a system by combing the functions of two or more chips into a single chip. Chips with various functions integrated are sometimes referred to as System On Chips (SOCs).

An example of a SOC is the Apple A17 Pro Application Processor chip—which comprises a six-core CPU, a six-core GPU, a sixteen-core neural engine, cache memory, video decoding, USB support and other functions. An SOC has some inherent advantages compared to multiple chips that provide the same functionality—such as smaller size, faster operation since signals travel a shorter distance on a single chip, and lower power since signals do not have to be driven as far. There are also disadvantages to SOCs, such as the fact that there are many transistors (on the order of about 19 billion on the Apple A17 Pro) and the chip size is usually large—both factors that can reduce the yield of good chips during wafer fabrication. Furthermore, designing a highly complex SOC requires a large engineering team, high cost for the complicated mask sets needed for wafer fabrication, and often relegates the fabrication of the SOC to one of a very few capable wafer fab companies.

Furthermore, for some high-performance computing chips the number of transistors needed is so large that the chips are at or near the limit of the reticle size of the photolithographic equipment used in wafer fabrication (the reticle size defines the maximum physical chip size that can be fabricated). While functional integration at the chip level in the form of an SOC or a high-performance chip is one alternative to providing advanced functionality—another option is to use simpler chips and integrate them at the package level. This approach has been described by various names such as multi-chip modules (MCMs), heterogenous integration, or System in Package (SiP), among others. While this packaging approach to combine multiple chips has been in use for many years, a more recent variation has emerged that coincides with the difficulties in fabricating advanced SOCs or high-performance chips. Complex chips may be dis-aggregated into smaller functional blocks and at the same time smaller physical blocks. These blocks are called chiplets. For example, rather than having a 64-core monolithic CPU chip, the same function might be separated into 8 smaller chiplets with each comprising 8 processor cores. These chiplets could be combined in a single package so that from the aspect of the functionality at the package level there would be no difference between a chiplet-based SiP and a packaged SOC.

Therefore, for purposes of this application and for ease of description a chiplet will provide a limited or single function or sub-function that is more limited in scope than found on a chip, which comprises full functionality. Furthermore, a chiplet is not a stand-alone unit that can function on its own like a chip and it must be combined with other chiplets to provide a desired function. Furthermore, for chiplets to be usable they must communicate with each other, so a chiplet-to-chiplet communication capability is a feature of chiplets that would not be typically present in a chip. With respect to the design of either a chip or a chiplet 34, they may comprise intellectual property (IP) blocks or cores. An IP block or core is essentially a circuit design for a certain function that can be re-used in different designs. IP blocks or cores may be provided at a logical circuit level or at a hardware definition level (e.g., physical circuit layout). If using IP blocks or cores, it would be more typical for a chiplet to use only one or at most a few IP blocks or cores while a chip might use many IP blocks or cores.

The deconstruction of a chip into chiplets or the use of separate chips versus an SOC allows for production of those different chips or chiplets with different wafer fabrication processes, each advantageous to themselves without needing to produce an entire chip using processes that may only be needed for a particular portion of the chip. Thus, fan-out devices 40 may be made with each chip or chiplet 34 utilizing specific processes and designs that are advantageous for themselves. As a result of separation and specialization of the chip or chiplets 34, additional efficiencies can be gained. For example, an advantage to this process is that chips or chiplets 34 that need more complex manufacture may be produced separately from chips or chiplets 34 that have simpler manufacturing requirements. As a result, packaged chips or chiplets 34 can provide system functionality as part of a fan-out device 40 that may be made for a lower cost, with improved yield, with reduced cycle time, with greater control for part sourcing.

Figure 1B:
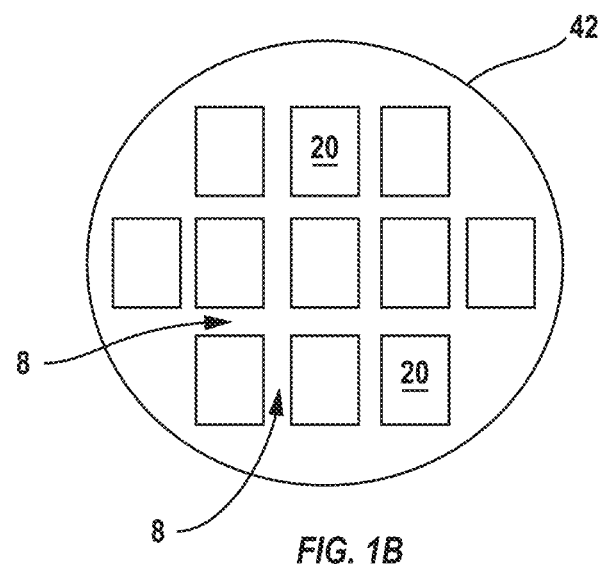
FIG. 1B illustrates an embodiment of a processor device or function.
Figure 1C:
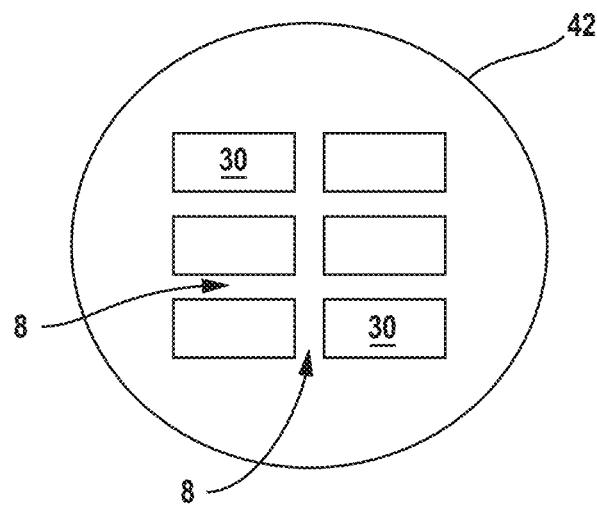
FIG. 1C illustrates an embodiment of analog devices.

The chip or chiplets 34 may be produced in a wafer fab on wafers 42 with multiple copies of the same or similar components being produced at a same time, as shown, e.g., in FIGS. 1A-1C. Different chips and chiplets having different functions may be formed separately at different times and at different fab locations, before being singulated and subsequently recombined into a fan-out device 40, as shown, e.g., in FIGS. 2 and 3.

Advantages for fan-out devices 40 are available when the chips or chiplets 34 are formed as chips comprising specialized functionality (not an SOC) and chiplets comprising only partial functionality. In contrast to an SOC that is self-contained or fully functional on its own, the fan-out device 40 may comprise chips or chiplets 34 that do not provide a full system function on their own. As such, chiplets, may not be self-sufficient, and may not be stand-alone components, thereby requiring two or more of the chiplets to communicate, operate together, or to be combined, in order to be fully functional.

In certain embodiments, the chips or chiplets 34 may comprise a first function or device (such as, e.g., a memory device or function) 10 and a second function or device (such as, e.g., a memory device or function) 20. While memory and processing are used as non-limiting examples of the first function or device 10 and the second function or device 20, a person of ordinary skill in the art (POSA) will appreciate that any desirable device or function may be included as (or substituted for) the device or function 10 and the device or function 20. As a non-limiting example (and for ease of description throughout the application), the chips or chiplets 34 may comprise one or more of a memory function or device 10, a processing device or function 20, such as a processor core, as well as one or more additional components 30, which may comprise one or more of passives, a multiplier function, a clock, an AI accelerator, an IP block, an analog function, an IO function. as well as compound components 38 that comprises two or more subcomponents 39, which for example could be discrete passive devices or other items or units.

Advantages are also available when the chips or chiplets 34 comprise only chips, only chiplets, or a mixture of chips and chiplets. In an embodiment, chips or chiplets 34 may comprise chips of full functionality, such as specialized chips that are paired with other fully functional chips. A POSA will appreciate that the methods and structure described herein also apply to implementations that comprise chips comprising full devices or full functionality (e.g., MCU, memory and PMIC) in a FOWLP that is part of the fan-out device 40 that is then embedded in a leadframe or laminate package. Thus, the discussion of chips or chiplets 34 that comprise partial or limited functionality as chiplets is by way of example, and not by limitation. In other instances, the chips or chiplets 34 will comprise complete of fully functional instances of memory, processing, and other functionality. In light of the explanation above, and for ease of description herein, a memory "device" correlates to a "chip," and a memory "function" correlates to a chiplet. Similarly, a processor "device" correlates to a "chip," and a processor "function" correlates to a chiplet.

Figure 2:
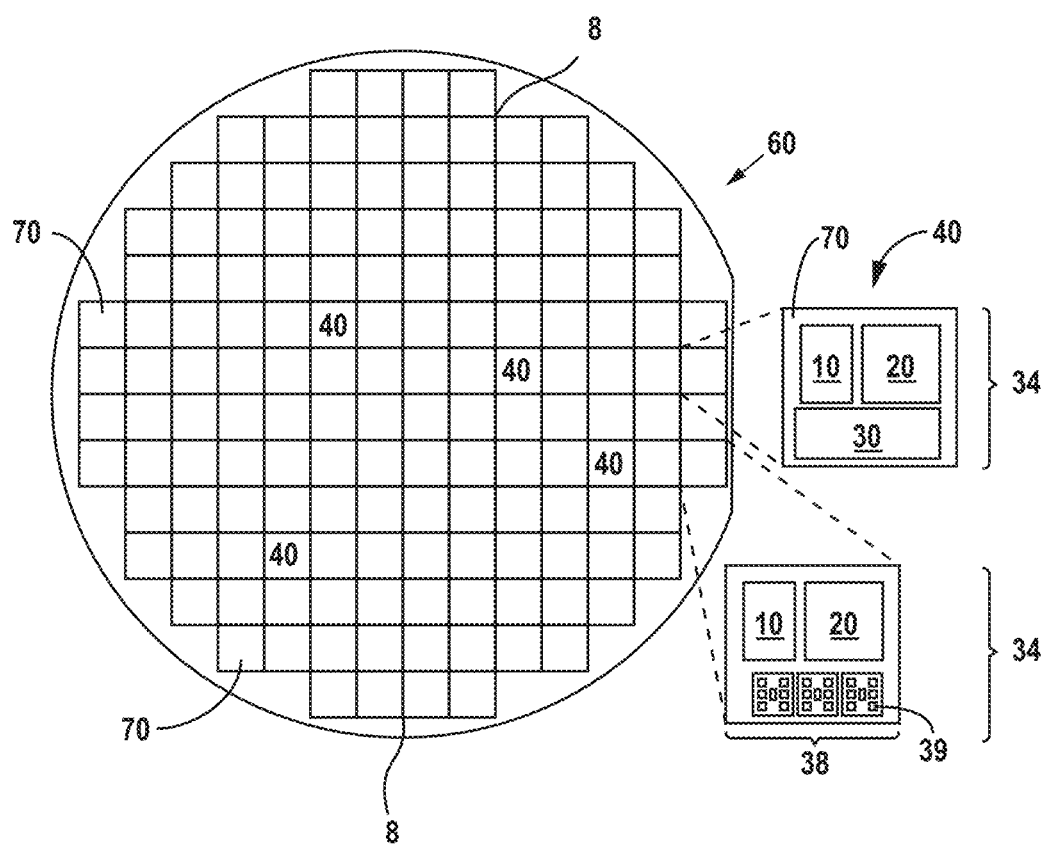
FIG. 2 illustrates a plan view of an embodiment of a reconstituted panel comprising a plurality of fan-out devices.

The functions of different chips or chiplets 34 may comprise a memory device or function 10 (as shown in FIG. 1A), a processor or processor function 20 (as shown in FIG. 1B), and one or more additional components or functions 30 (as shown in FIG. 1C). Components 30 may comprise a chip or non-chip and may further comprise one or more of an analog device, a passive device, a power transistor, an RF device, a multiplier function, a clock, an AI accelerator, another IP package, and a chiplet disposed at least partially within an encapsulant or first encapsulant 70, as described in greater detail below. In some embodiments, fan-out devices 40 may comprise compound components 38 formed of one or more smaller subcomponents 39, as shown in FIG. 2. For example, smaller subcomponents 39 may comprise a number of discrete passive devices that may be combined to form a compound component 38. The chips or chiplets may be combined and formed into a plurality of fan-out devices 40 disposed on a temporary carrier 50 which in some embodiments may comprise a wafer, to form a reconstituted panel 60 which in some embodiments may comprise a wafer, as shown according to a particular embodiment in the plan view of FIG. 2. FIG. 2 further shows compound component 38, which may comprise subcomponents 39.

In certain embodiments, the fan-out device 40 comprises two or more chips or chiplets 34, which may include only chips, only chiplets, or a mixture of both chips and chiplets. More specifically, the chips or chiplets 34 may comprise one or more of a memory device or function 10, the memory device or function 10 comprising NVM, dynamic random access memory (DRAM), SRAM, or any other suitable type of memory, and a processor or processor function 20 comprising a microcontroller unit (MCU). In some instances the fan-out device 40 may further comprise at least one additional component 30 comprising one or more of an analog device, a passive device, comprising one or more resistors, capacitors, inductors, or integrated passive devices (IPDs), a power management IC (PMIC), a transistor, a diode, an RF device, a multiplier function, a clock, an AI accelerator, another intellectual property (IP) function, and a chiplet disposed at least partially within the first encapsulant 70. The AI accelerator, also referred to as a deep learning processor or neural processing unit (NPU), may comprise a specialized component designed to be compatible with a corresponding software component designed to accelerate the performance of AI-based applications. AI accelerators, and related software components, may govern components optimized for specific computations as required by machine learning algorithms.

Some electronic assemblies and assembly components have fan-out interconnect structures 80 wherein at least a portion of the fan-out interconnect structure 80 is disposed over the fan-out device 40, and the fan-out device 40 comprises unit specific patterning such that a misalignment between an edge of the at least one fan-out device 40 and the input output pads 48 is less than a misalignment between an edge of the fan-out device 40 and an edge of each of the memory device or function 10, the processor device or function 20, and the at least one additional component 30.

In certain embodiments, at least a portion of the fan-out devices 40 are coupled to a leadframe 526. In other embodiments, at least a portion of the fan-out devices 40 are coupled to a laminate substrate 200. Yet other embodiments have the fan-out interconnect structure 80 disposed over the first encapsulant 70.

Some leadframes 526 comprise a plurality of mounting sites or die flags 527. In certain embodiments, a plurality of the fan-out devices 40 are mounted on at least a portion of the mounting sites or die flags 527. In certain embodiments, at least a portion of fan-out devices 40 comprise wire bonds 530. In alternate embodiments, at least a portion of fan-out devices 40 comprise flip chip bumps 16.

Embodiments of laminate substrates 200 comprise a plurality of mounting sites 204 and in embodiments, a plurality of the fan-out devices 40 are mounted on at least a portion of the laminate substrate mounting sites 204. In certain embodiments, at least a portion of fan-out devices 40 comprise wire bonds 530. In further embodiments, at least a portion of fan-out devices 40 comprise flip chip bumps 16.

Some fan-out devices 40 comprise a conductive heatsink, flag, or lid 208 which in some embodiments may be disposed on a backside of at least one chip or chiplet 34. The conductive heatsink 208 may be coupled to the mounting site 527 on the leadframe 526. In other embodiments the conductive heatsink 208 may be coupled to the mounting site 204 on the laminate substrate 200. In further embodiments, a heatsink 208 may be embedded within the laminate substrate 200 at a location corresponding to that of a backside of at least one chip or chiplet 34.

Figure 11:
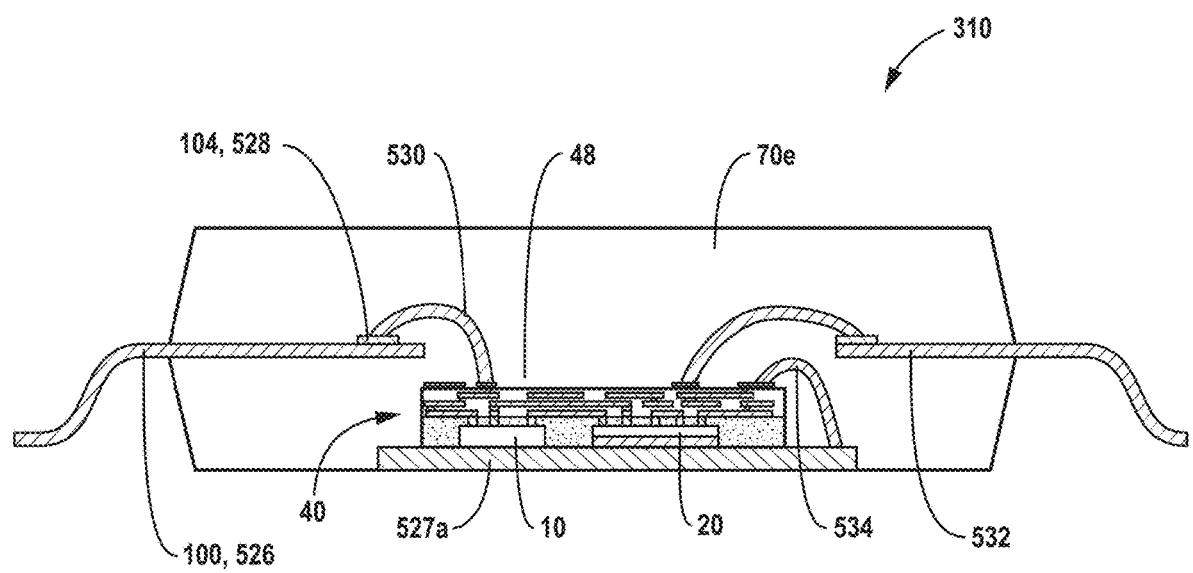
FIG. 11 illustrates a side view of an embodiment of an electronic assembly component comprising a fan-out device disposed on a particular embodiment of the structural support of FIG. 5, including "gull wing" leads extending from sides of the electronic assembly.

Certain electronic assemblies have a portion of the leadframe that may be depressed. In some depressed leadframes, the depressed portion of the leadframe forms a depressed die attach flag 527a, as depicted in FIG. 11.

In some embodiments, the input output pads 48 of the fan-out device 40 comprise a plurality of wirebond pads coupled to first ends of the plurality of wirebonds, and second ends of the plurality of wirebonds are coupled to pads of the leadframe or pads of the laminate substrate 200 or the PCB. a fan-out interconnect structure 80 for each of the plurality of fan-out devices 40. In certain embodiments, are coupled to the plurality of wirebond pads; In alternate embodiments, second ends of the plurality of wirebonds are coupled to portions of the laminate substrate 200.

In other embodiments, the input output pads 48 comprise a plurality of flip chip pads wherein the flipchip pads are coupled to a fan-out interconnect structure 80 for each of the plurality of fan-out devices 40. In certain embodiments, the input output pads 48 comprise a plurality of flip chip pads that are coupled to portions of the leadframe 526 through a flip chip bump 16. In alternate embodiments, the input output pads 48 comprise a plurality of flip chip pads that are coupled to portions of the laminate substrate 200 through the flip chip bump 16.

As such, the above structures, methods, and advantages will be more fully appreciated in light of the additional disclosure and examples presented herein. Traditional chips, integrated circuits (ICs), or semiconductor die may comprise architecture that comprises multiple functions, including processing (or a central processing unit (CPU)), memory, and other functionality. Higher performance chips with greater speed and more capabilities are more expensive than chips with less functionality and lesser speeds. The more expensive higher functionality chips may incur additional expense by needing to use more sophisticated and higher end manufacturing processes (e.g. with higher precision and tighter tolerances) that incur additional cost. The more sophisticated processing is used in the making of the entire chip, even when only a portion of the chip architecture might require the more sophisticated processing.

The chips or chiplets may be placed adjacent one another, such as in a side-by-side arrangement, so that multiple chiplets may be formed at a re-constituted wafer or panel level 60 and processed through various fabrication steps, before being singulated into individual packages. FIG. 2 illustrates saw streets 8 through encapsulant 70 to singulate the reconstituted panel 60, or wafer in some embodiments, into individual packages comprising fan-out devices 40.

Figure 3:
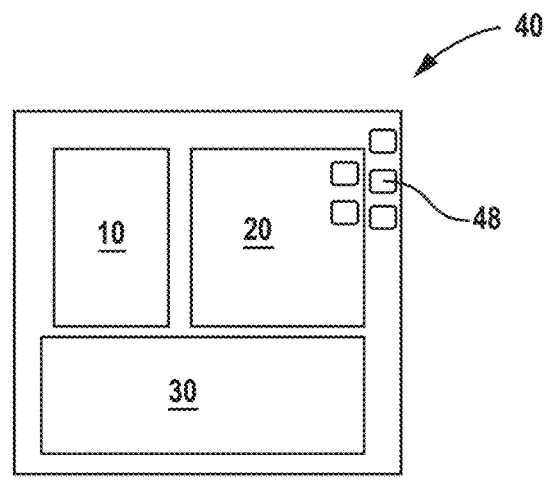
FIG. 3 illustrates a plan view of a fan-out device comprising a memory device or function, a processor device or function, and an analog device, further illustrating input output pads.

One or more chips or chiplets 34 may be used in forming the fan-out device 40, as shown in FIG. 3 and FIGS. 4A-4F. FIG. 3 illustrates a plan view of a particular non-limiting embodiment of fan-out device 40 comprising three chips or chiplets 34 of a memory device or function 10, a processor device or function 20, and an additional component 30, where the additional component 30 may comprise one or more of an analog device, a passive device, a power transistor, an RF device, a multiplier function, a clock, an AI accelerator, another IP package, and a chip or chiplet disposed at least partially within the first encapsulant, the three chips or chiplets 34 being surrounded by and encased within first encapsulant or mold compound 70. Input output pads 48 may be disposed over the fan-out device 40 and formed on the encapsulant 70.

The chips or chiplets 34 are disposed face-up over the temporary carrier 50. The encapsulant 70 may be disposed around the chips or chiplets 34, around four side surfaces of each of the chips or chiplets 34, over the active layer of the chips or chiplets 34, and around conductive studs 12, which are formed over the active layer of the chips or chiplets 34 (shown, e.g., in FIGS. 4C to 4F). While the conductive studs 12 are shown as being coupled to the memory device or function 10 and the processor device or function 20, a POSA will understand that conductive studs 12 may be coupled to additional components 30, such as an analog device, a passive device, a power transistor, an RF device, a multiplier function, a clock, an AI accelerator, another IP package, and a chiplet. As used herein, over, on or around may mean in direct contact with, or with other intervening layers, such as polymer or polyimide layers disposed between the chips or chiplets 34 and the encapsulant 70. The conductive studs 12 may be in contact with, surrounded by, partially encircled by, or encapsulated or molded with a single encapsulant, polyimide or mold compound at a single step such that the same first encapsulant 70 or mold compound is disposed around the chips or chiplets 34. The first encapsulant 70 can be deposited around the plurality of chips or chiplets 34 using a paste printing, compression molding, transfer molding, injection molding, liquid encapsulation, dispensing, lamination, vacuum lamination, spin coating, slit or slot die coating, or other suitable application. The first encapsulant 70 comprises an organic material, a mold compound, a polyimide, a composite material, such as epoxy resin with filler, such as ABF or epoxy acrylate with filler, and is a material suitable for planarizing, such as through chemical mechanical planarizing (CMP), surface planarizing (e.g., with a diamond cutter as offered by Disco™ and others), or grinding. As such, in some instances the first encapsulant 70 will not be a polymer material, such as an un-filled polyimide, that does not perform well in a grinding operation, and may gum-up a grinding wheel.

The input output pads 48 may also be coupled to a fan-out interconnect structure 80 (as shown, e.g., in FIGS. 4D-4F) for each of the plurality of fan-out devices 40. In some embodiments, the fan-out interconnect structure 80 may comprise a molded direct contact interconnect structure 186, as discussed further below. In alternate embodiments, the fan-out interconnect structure 80 may comprise a build-up interconnect structure 90 comprising a dielectric material 64 comprising a polymer such as polyimide (PI), or other suitable insulating or passivation material. As shown in FIG. 2, the fan-out device 40 can be singulated from the reconstituted panel 60 or wafer to form the fan-out device 40 comprising input output pads 48 as illustrated in FIG. 3.

FIG. 3 shows the input output pads 48 disposed over only a portion or corner area of the fan-out device 40, shown at the top right of the fan-out device 40. However, the POSA will appreciate that the input output pads 48 can extend across an entire surface of the fan-out device 40, such as in multiple rows or across an entire surface of fan-out device 40. The input output pads 48 may be formed as wirebond pads, and may also be formed as bond pads for flip chip mounting.

Figure 4A:
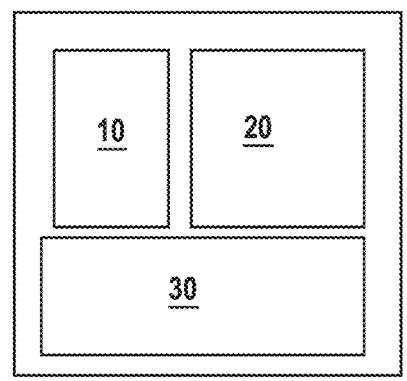
FIG. 4A illustrates the fan-out device of FIG. 3, assembled from a variety of chips or chiplets.

FIG. 4A shows a plan view of a fan-out device 40 similar to that of FIG. 3, assembled from a variety of chips or chiplets 34, including a memory device or function 10, a processor device or function 20, and at least one additional component 30.

Figure 4B:
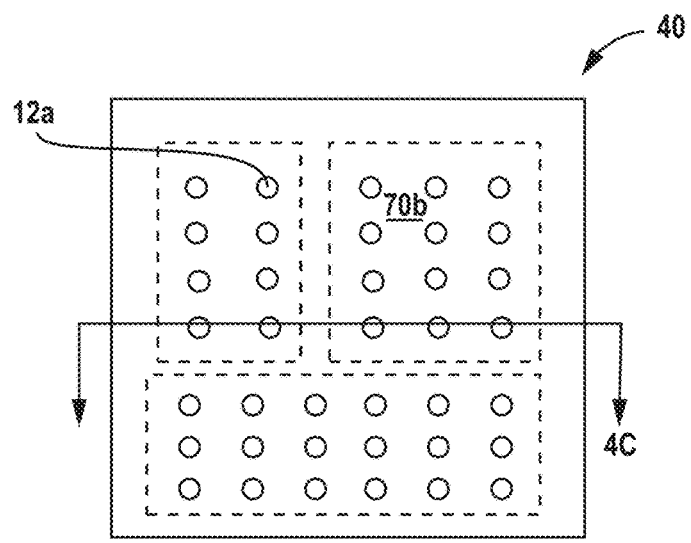
FIG. 4B illustrates a cross-section view of the fan-out device of FIG. 4A, showing a memory device or function and a processor device or function, and conductive studs surrounded by encapsulant.
Figure 4C:
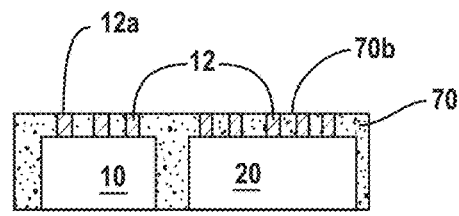
FIGS. 4C-4H illustrate various views in the process of forming molded direct contact interconnect or multi-layer structures comprising the memory device or function, processor device or function, and analog devices from FIGS. 1A-1C and FIG. 2, further depicting input output pads.

FIG. 4B is a depiction of a top or plan view of a fan-out device 40, similar to the view of FIG. 4A, but FIG. 4B is taken across a planarized surface 70b of encapsulant 70 as shown in FIG. 4C. FIG. 4B shows the conductive studs 12 formed over the chip or chiplets 34, similar to what is shown in the side view of FIG. 4C, further illustrating an end 12a of conductive studs 12 after having been planarized.

FIG. 4C is a cross-sectional side view taken along the section line 4C shown in FIG. 4B. FIG. 4C illustrates a memory device or function 10 and a processor device or function 20 (and at least one additional component 30 not shown in this view), surrounded by encapsulant 70 face-up as they would be disposed over a temporary carrier 50, each of which may be formed with or without conductive studs 12. In some instances, the temporary carrier 50 may be a metal carrier, a silicon carrier, a glass carrier, or a carrier made of other suitable material used for the molding or encapsulating process, and then be removed after the encapsulant 70, such as mold compound, filled epoxy film such as ABF, or other dielectric such as polyimide has been placed, cured, or both, such that the encapsulant 70 provides structural support and the temporary carrier 50 is no longer needed for processing.

A conductive stud 12 is one embodiment of a conductive interconnect structure that has generally vertical sides and may be wider than it is tall, built-up on a substrate, such as over an active layer of a chip or chiplets 3, polyimide or mold compound. A conductive stud 12, though typically formed of the same materials as a pillar or post would be formed, may be different than a pillar or post which each has a height greater than its width. A conductive stud 12, though it commonly is formed in a cylindrical shape, may be formed in any polygonal or other shape and size. Another use for a conductive stud is as a dummy thermal conductive stump that is not electrically coupled to an active electrical circuit but is instead thermally coupled to a heat source of an active device to dissipate the heat to another structure, such as to an input output pad on a surface of the package. The generally vertical sides of a conductive stud 12 are different from the sides shape that exists for a solder ball or a squished out solder ball that has generally rounded sides, because the generally vertical nature of a conductive stud 12 comes from imperfections in being formed in a structure that has been previously developed or etched, such as within openings in a photoresist layer. Developing or etching does not generally perfectly or uniformly remove the photoresist within the openings, and therefore forms imperfect, generally vertical openings for deposition of the conductive stud. Generally vertical includes perfectly vertical and imperfectly vertical sides. A conductive stud 12 is not a wire bond or flip chip bump or solder.

Planarizing or grinding the encapsulant to expose the conductive studs exposes ends of the conductive studs with the planarized encapsulant surface. The planarizing or grinding of the encapsulant produces a flatness of within a range of about 0.5-5 micrometers and a total roughness height from peak to valley measured over a 1 millimeter (mm) length of between 5 and 500 nanometers (nm). While conventional encapsulant grinding might be done with less flatness, greater accuracy and precision can be obtained by using integrated sensors such as laser, acoustic, or other non-contact methods to control the grinding resulting in better flatness. In some instances, the first conductive stumps may be formed with a height of less than or equal to about 50 micrometers (μm) or less than or equal to about 250 μm, and then be ground down to a height of less than its original height, such as, in a particular embodiment, less than or equal to about 4 μm or 1 μm. As used herein, "about" or "substantially" means a percent difference less than or equal to 50% difference, 40% difference, 30% difference, 20% difference, 10% difference, or 5% difference.

Figure 4D:
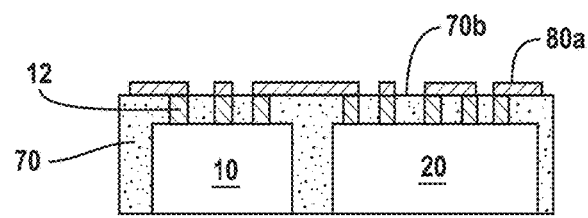

FIG. 4D, continuing from FIGS. 4B and 4C, is a depiction of a cross-sectional side view of the encapsulated chips or chiplets 34, showing the conductive studs 12 within the encapsulant 70. A conductive redistribution layer (RDL, and a first formed seed layer) 80a may be formed over the flat or planar surface of FIGS. 4B and 4C. The conductive layer 80a may comprise a redistribution layer (RDL) comprising traces, and other features. The conductive layer 80a may be part of a fan-out interconnect structure 80 that is disposed both over a footprint of the chip or chiplet 34 as well as over the encapsulant 70 and outside a footprint of the chips or chiplets 34. The conductive studs 12 may be electrically coupled to the conductive layer 80a.

Figure 4E:
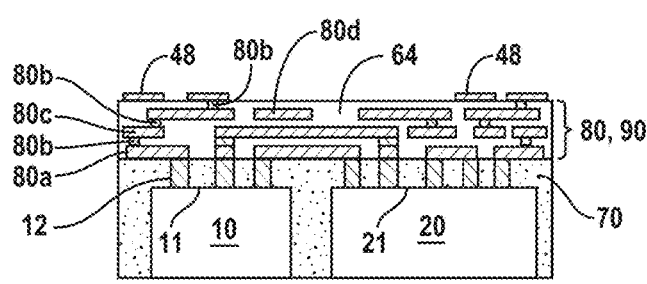
Figure 4F:
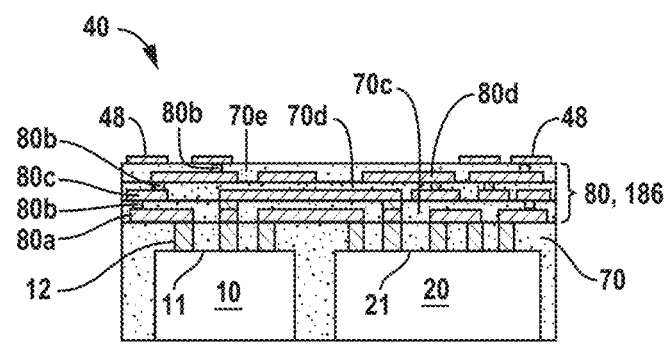

FIGS. 4E and 4F add an insulating or passivation layer 64, or additional encapsulant layers 70c and 70d, to FIG. 4D, as well as additional routing layers 80b and 80c for forming wire bond pads, fanouts and/or LGA pads for flip chip bonding. FIG. 4E, continuing from FIG. 4D, is a depiction of additional layers of dielectric material, such as insulating or passivation layers 64, and additional conductive layers 80b and 80c comprising routing for wire bond pads, fanouts and/or LGA pads for flip chip bonding, being formed to create a fan-out interconnect structure 80 comprising a build-up fan-out interconnect structure 90 as depicted. The dielectric layers 64 of FIG. 4E can be one or more layers that are applied using PVD, CVD, screen printing, spin coating, spray coating, sintering, or thermal oxidation. The dielectric layers 64 may be one or more layers of $SiO_2$, $Si_3N_4$, SiON, $Ta_2O_5$, $Al_2O_3$, PI, BCB, PBO or other material having similar insulating and structural properties. In an embodiment, the dielectric layer 64 is a dry film resist layer. In particular embodiments according to FIG. 4E, the fan-out interconnect structure 90 of the at least one fan-out device 40 is formed comprising PI. The insulating layer may be patterned and a portion of the insulating layer may be removed by developing, etching, laser drilling, mechanical drilling, or other suitable process to form openings completely through the insulating layer and to expose the conductive seed layer or RDL 80a for subsequent plating or formation of conductive layers 80b and 80c, to allow connectivity from one conductive layer to another between dielectric layers 64. The insulating layer may be patterned to facilitate the formation of traces, vias, bussing lines, tie bars, and reinforcement strips. The insulating layer may also be patterned to facilitate the formation of contact pads within conductive layers 80b and 80c, and redistribution layers (RDLs) 80a as part of a fan-out interconnect structure 80 for the fan-out devices 40 that are coupled or connected to at least one bussing structure. In an embodiment, a photoimageable PI may be used and after imaging, a developer (such as a chemical developer) may be used to form the via holes.

FIG. 4F, similar to FIG. 4E, is a depiction of additional layers 70c, 70d of encapsulant 70 (rather than other dielectric material by omitting the insulating material and using additional mold compound layers 70c and 70d throughout the structure) and additional conductive layers 80b-80c being formed to create a fan-out interconnect structure 80. In the particular embodiment of FIG. 4F, the fan-out interconnect structure 80 of the at least one fan-out device 40 is formed comprising a molded direct contact interconnect structure 186 as is known under the trademark or tradename MDx™. Molded direct contact interconnect structures 186 (and a method for making and using the same) are discussed in U.S. patent application Ser. No. 18/195,090, and issued on Apr. 30, 2024 as U.S. Pat. No. 11,973,051, the entirety of which is hereby incorporated herein by reference. Molded direct contact interconnect structures 186 may comprise or provide: (i) large area chip bond pad interconnect to create a very low contact resistance, (ii) removal of capture pads between build-up layers, such as traces, (iii) cost savings by removing polyimide and other polymers from the build-up layers, using mold compound instead, and (iv) facilitate ultra-high-density connections such as 20 micrometer bond pitch and smaller. FIG. 4F (as well as FIG. 4E) further illustrates input output pads 48, which may comprise wire-bond pads or bond pads for flip chip bonding, for electrical connection of the fan-out device 40 to a structural support 100, which in certain embodiments may comprise a laminate substrate 200, or in other embodiments may comprise a leadframe 526.

Figure 4G:
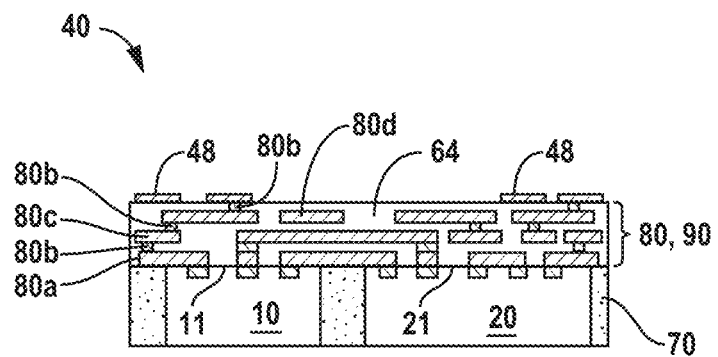
Figure 4H:
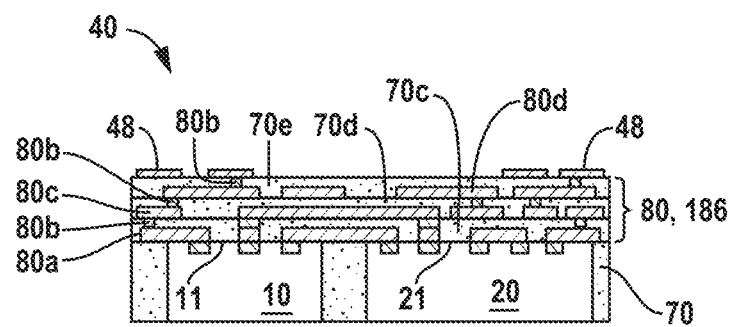

While embodiments of the electronic assemblies and components as disclosed herein may be depicted in some figures as comprising the molded direct contact interconnect structure 186, and in other figures as comprising the build-up fan-out interconnect structure 90 comprising PI, a POSA would understand that the fan-out interconnect structure 80 refers collectively to either of the molded direct contact interconnect structure 186, or the build-up fan-out interconnect structure 90 comprising dielectric 64 such as a polymer, PI, or other suitable insulating or passivation layer. Specific embodiments of the fan-out interconnect structure 80 may be selected according to design, cost, performance, and other requirements of the final electronic assembly. For example, FIGS. 4G and 4H, similar to FIGS. 4E and 4F, respectively, illustrate an embodiment in which the fan-out device 40 is formed without conductive studs 12 coupled to the memory device or function 10 and the processor device or function 20. As such, the single encapsulant 70 that is disposed over or around the memory device or function 10 and the processor device or function 20 may not extend over active surface or first surface 11 and 21, respectively. Instead, the build-up interconnects structures 80, 90, 186 may be formed more closely over the memory device or function 10 and processor device or function 20 to form a modified variation of fan-out device 40. A POSA will appreciate that the above-described fan-out device 40 may be included in any subsequent figure or arrangement when variations of the fan-out device 40 with the conductive studs 12 are illustrated.

At least some of the above advantages are available at least in part by using unit specific patterning (such as adaptive patterning (custom design and lithography) and build-up interconnect structures such as a frontside build-up interconnect structure, which is also known under the trademark "Adaptive Patterning," referred to as "AP." Unit specific patterning: (i) allows for the use high-speed chip attach for semiconductor chips and AP will ensure alignment for high density interconnects with the molded direct contact interconnect structures. Adaptive Patterning may also be used in the herein disclosed processes for manufacturing QFN, DFN, SON and other packages including the ability to make large area connections which are precisely aligned to chip bond pads for very low contact resistance.

Figure 5:
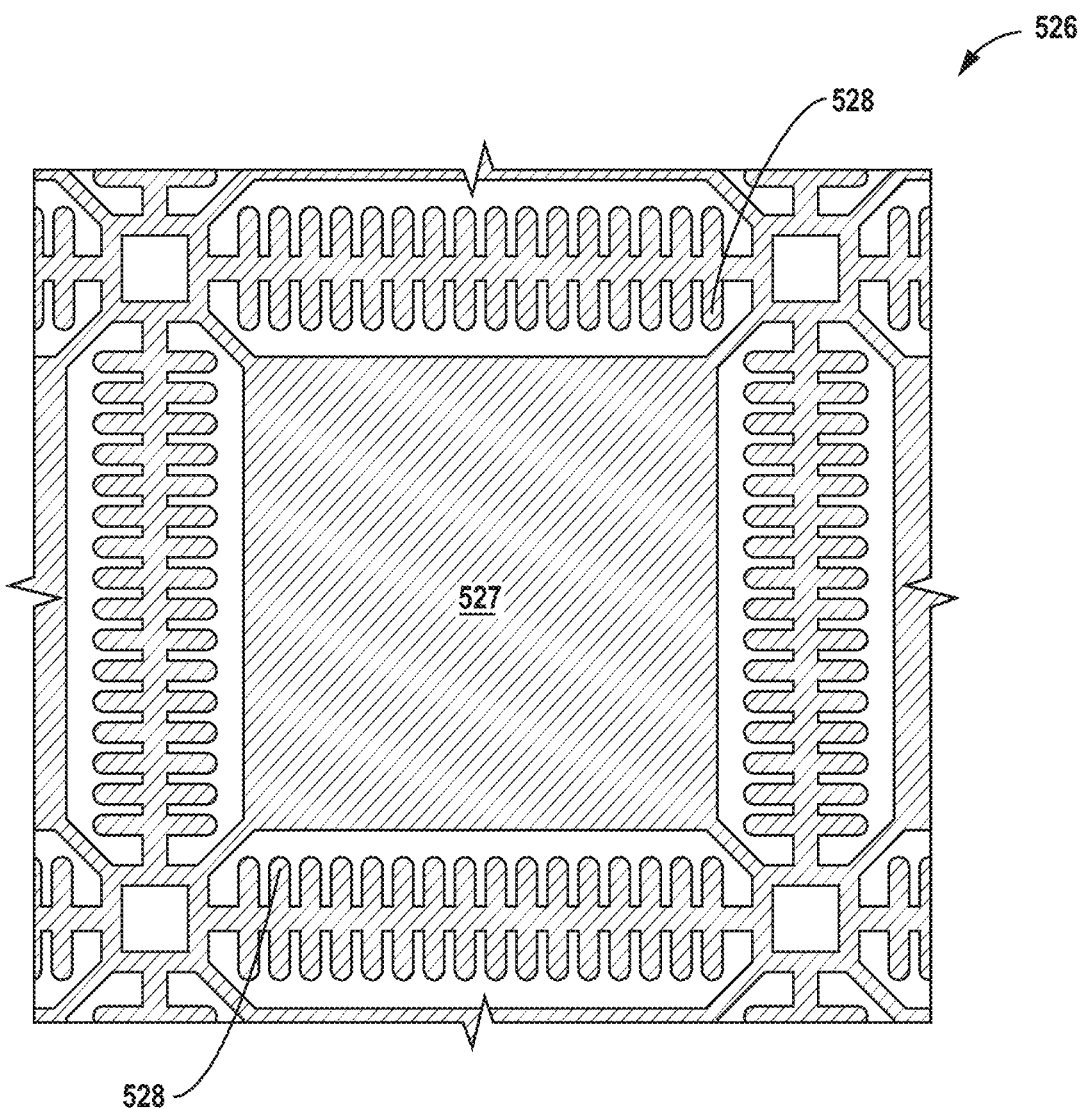
FIG. 5 illustrates one embodiment of a structural support comprising a leadframe.

QFN, DFN and SON packages are a near chip-scale plastic encapsulated package made with a metal leadframe substrate. FIG. 5 illustrates a non-limiting example of a leadframe 526 to which chip or chiplets 34, fan-out devices 40, ICs, or semiconductor chips may be mounted. A leadframe 526 is the metal structure inside a leadframe-based chip package that creates leads which carry signals and power to and from the chip to the outside through metal conductors leading away from the chip. QFN, DFN and SON packages comprise perimeter land pads on the package edge to provide electrical connections to the PCB, rather than using leads that extend beyond the body of the package. In other instances, leads may extend beyond a package edge, such as when forming "gull wing leads" as known in the art. During packaging prior to singulation, the package may be in strip form, connected to adjacent packages on the leadframe. This also means that they are electrically interconnected through the conductive leadframe. The packages are later isolated or separated by cutting between the packages. In conventional leadframe packages, partial sawing or punching to isolate each unit electrically is required before testing to allow electrical testing of the individual packaged semiconductor chips, and may also be present.

FIGS. 6A, 7A, 8A, 9A, 10A and 11 illustrate various embodiments in which a fan-out device 40 may be coupled to a structural support 100 which, in one embodiment, may comprise a leadframe 526 to form chip-based or chiplet-based fan-out electronic assembly components as part of a leadframe package. The electronic assembly components of the immediately above-referenced figures (corresponding to embodiments 210, 230, 250, 270, 290 and 310, respectively, as illustrated and described further below) may comprise at least one fan-out device 40. The fan-out device 40 may comprise a first encapsulant 70 disposed around at least a memory device or function 10 and a processor device or function 20. In other instances, an electronic assembly may be made with the fan-out device 40, and the structural support 100 without encapsulant, so as to form a cavity package with no encapsulant. A fan-out interconnect structure 80 may be disposed over the first encapsulant 70 of the fan-out device 40. In some embodiments, the fan-out interconnect structure 80 may comprise a molded direct contact interconnect structure 186. In other embodiments, the fan-out interconnect structure may comprise a build-up interconnect structure 90 comprising dielectric 64. Input output pads 48 may be disposed over at least a portion of the fan-out interconnect structure 80. The electronic assembly components further comprise a structural support 100 comprising a leadframe 526. The leadframe 526 may have electrical routing 102 and structural support pads 104. In some embodiments, the structural support pads 104 may comprise bond leads 528 as part of the leadframe 526. The structural support 100 further comprises at least one mounting site 108, where in those embodiments comprising a leadframe, the mounting site may be referred to as die flag 527. In those embodiments comprising wire bond configurations, the fan-out device 40 may be coupled to die flag 527 using a die attach adhesive, solder, or other materials and methods as known in the art. In other embodiments comprising flip chip configurations, the fan-out device 40 may be coupled electrically to the mounting site 527 using flip chip bumps 16, and further including a molded underfill 70*a* (as illustrated in FIGS. 7A, 7B, 9A and 9B). The molded underfill 70*a* is disposed between the fan-out device 40 and the mounting site 108 of the structural support, and surrounding the flip chip bumps 12. The molded underfill 70*a* may be polymer composite material, such as epoxy resin with filler, epoxy acrylate with filler, or polymer with proper filler. The molded underfill 70*a* may help to offset any coefficient of thermal expansion (CTE) mismatch between the structural support 100 and the fan-out device 40, as well as preventing moisture ingress into the electronic assembly components and imparting mechanical strength.

Figure 7A:
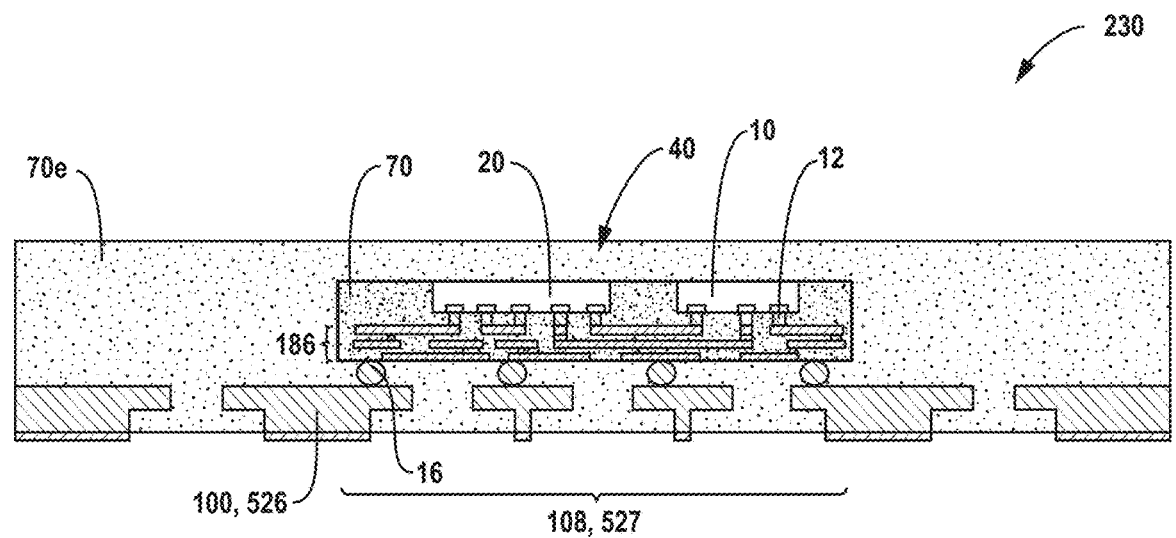
FIG. 7A illustrates a side view of an embodiment of an electronic assembly component comprising a fan-out device comprising a memory device or function, a processor device or function, and an analog device (not shown in this view) and a molded direct contact interconnect structure, the fan-out device coupled to the structural support of FIG. 5, and electrically connected by flip chip bumps.
Figure 9A:
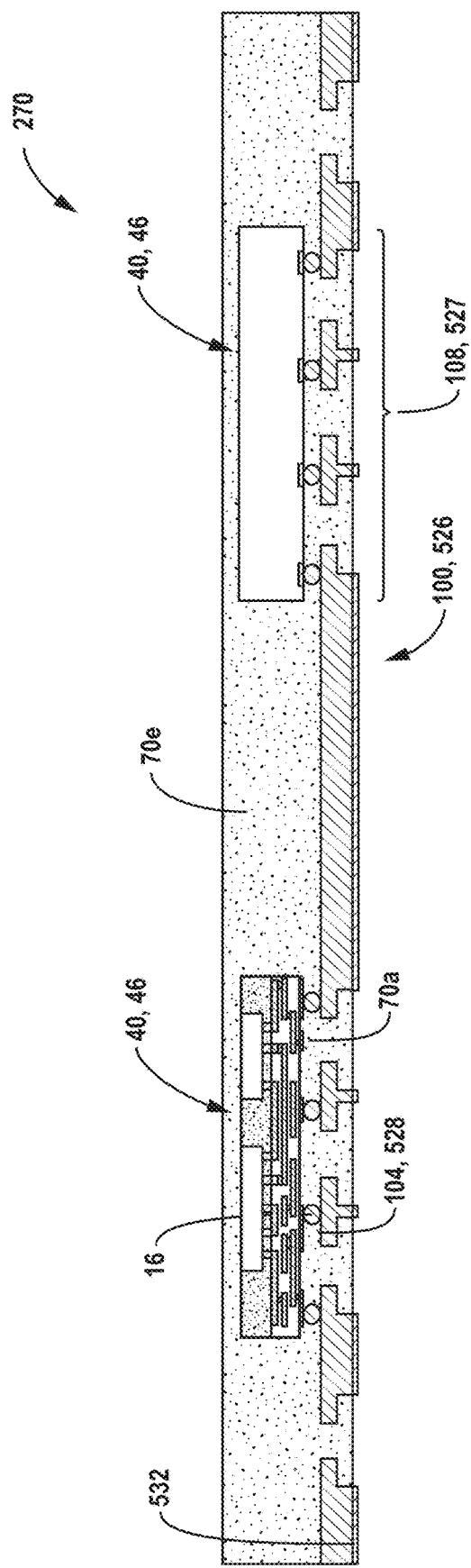
FIG. 9A illustrates a side view of an embodiment of an electronic assembly component comprising at least one flip chip bonded fan-out device, further comprising additional flip chip bonded components, coupled to the structural support of FIG. 5 and electrically connected by flip chip interconnects.
Figure 9B:
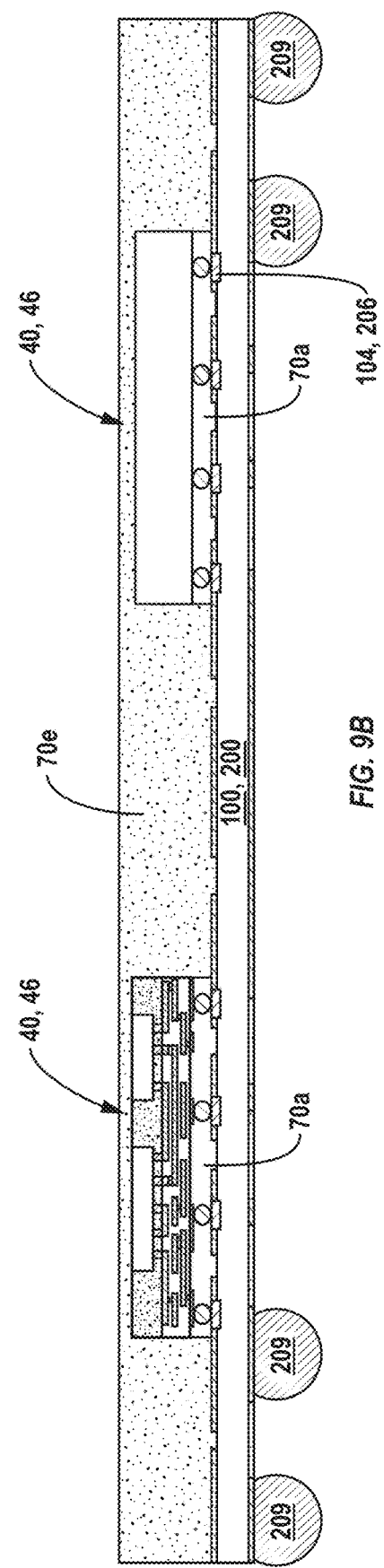
FIG. 9B illustrates a side view of an embodiment of an electronic assembly component comprising at least one flip chip bonded fan-out device, further comprising additional flip chip bonded components, coupled to a structural support comprising a laminate substrate and electrically connected by flip chip interconnects.
Figure 10A:
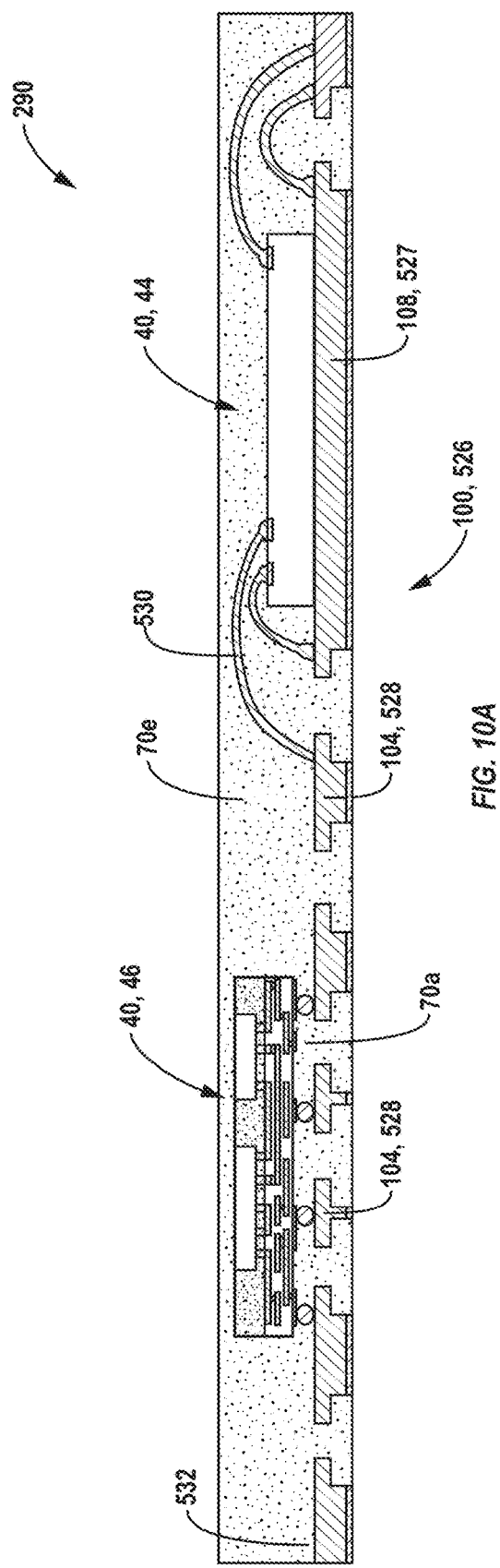
FIG. 10A illustrates a side view of an embodiment of an electronic assembly component comprising a structural support comprising a leadframe, one embodiment as shown in FIGS. 5, 6A-9A, having disposed thereon: at least one fan-out device disposed face down and connected to the structural support by flip chip bumps, and at least one fan-out device disposed face up and connected to the structural support by wire bonds.

For leadframe packages 230, 270, 290, the mold compound may also be the underfill, as illustrated in FIGS. 7A, 9A, and 10A, respectively. For laminate packages, in some embodiments a conventional underfill 70*a* (such as that shown in FIGS. 7B and 9B) may be dispensed and cured before package molding 70*e*—or the package mold compound 70*e* could also be the underfill 70*a* (i.e. a molded underfill), which would comprise package molding 70*e* similar to what is illustrated in FIGS. 7A and 9A, but with a substrate 100, 200 instead of leadframe 526.

The input output pads 48 of the at least one fan-out device 40 may be electrically coupled by an electrical connector 106 to structural support pads 104, also referred to as bond leads 528 in embodiments comprising a leadframe 526. The electrical connector 106 may comprise a flip chip bump 16 or a wire bond 530. A second encapsulant or mold compound 70*e* may be disposed over at least a portion of the fan-out device 40 and the structural support 100 comprising leadframe 526 as shown in FIGS. 6A, 7A, 8A, 9A, 10A and 11, following.

Figure 6A:
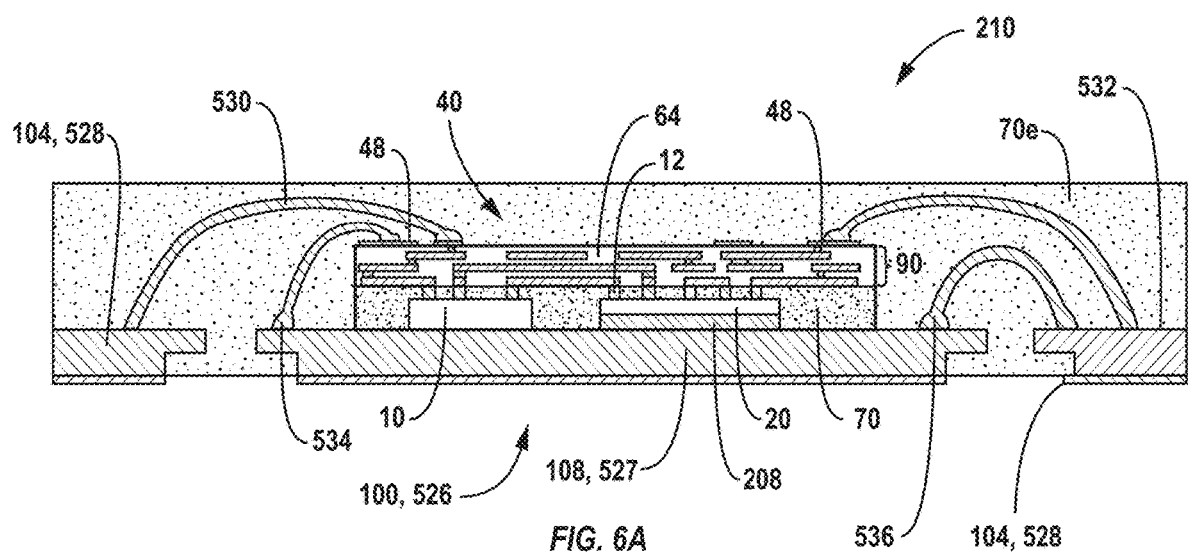
FIG. 6A illustrates a side view of an embodiment of an electronic assembly component comprising a fan-out device comprising a memory device or function, a processor device or function, and an analog device (not shown in this view) and a build-up interconnect structure, the fan-out device coupled to the structural support of FIG. 5, and electrically coupled by wirebonds.

In the embodiments of FIGS. 6A, 7A, 8A, 9A, 10A and 11, the structural support may comprise a leadframe 526, as disclosed herein. The leadframe 526 may comprise copper, copper alloys or other electrically conductive metals. The leadframe 526 may comprise structural support pads comprising a layer 532 which may be disposed on the leadframe typically by electroplating, and other means of deposition as known in the art are not precluded. The layer 532 in some embodiments may comprise multiple layers that are compatible with wirebonding or flip chip bonding, such as silver, nickel-gold, or nickel-palladium and the like. In some embodiments, the layer 532 may comprise at least one layer of copper for copper wirebonding or flip chip bonding, whether separately or in combination with the above-referenced layers. In some embodiments, the fanout device 40 may comprise a conductive heatsink, 208 (as illustrated in FIG. 6A) which may be comprised of the same materials as the leadframe, or other, thermally conductive materials as known in the art.

The electronic assembly components of FIGS. 6A-10B further comprise external or package input-output pads comprising one or more lands, balls, leads, pins, and external interconnects 209. Although depicted for FIGS. 6A-7B and 10A and 10B, a POSA would understand that external interconnects 209 would be included in a similar manner in all embodiments of FIGS. 6A-10B.

FIG. 6A illustrates an electronic assembly component 210 comprising a fan-out device 40 comprising multiple chips or chiplets 34 connected through conductive interconnects 12 to a build-up interconnect structure 90 comprises dielectric material 64, such as a polymer or PI, which differs from the encapsulant 70*e* used as part of multi-layer interconnect structure 186. The fan-out device 40 may be coupled to a mounting site 108 of the structural support, corresponding to die flag 527 in those embodiments where the structural support 100 comprises a lead-frame 526. The fan-out device 40 may be electrically coupled (or configured to be electrically coupled) with or through the leadframe 526 by coupling first ends of a plurality of wirebonds 530 to a plurality of input output pads 48 (wirebond pads with reference to this embodiment) on the fan-out device 40; and coupling second ends of the plurality of wirebonds 530 to a plurality of structural support pads 104. The structural support pads 104 in those embodiments comprising the leadframe 526 may be referred to as bond leads 528, or bond fingers, as is known in the art. A second encapsulant or mold compound 70*e* may be disposed around and coupled to the structural support 100 comprising the leadframe 526, the wire-bonds 530, and the fan-out device 40. The second encapsulant 70*e* or mold compound may be the same or similar to the first encapsulant 70 used in the fan-out device 40.

FIG. 7A, similar to FIG. 6A, instead shows an embodiment 230 of the molded fan-out device 40 being flip chip mounted by way of flip chip interconnects 16 to electrical support pads 528 of the leadframe 526 of FIG. 5, rather than being wirebonded. FIG. 7A further illustrates the fan-out device 40 comprising a fan-out interconnect structure 80 comprising a molded direct contact interconnect structure 186. In other embodiments, the fan-out interconnect structure 80 may comprise a multi-layer structure comprising dielectric 64, such as a polymer or PI. The fan-out device 40 may be coupled to the leadframe 526 by molded underfill 70*a*.

Figure 8A:
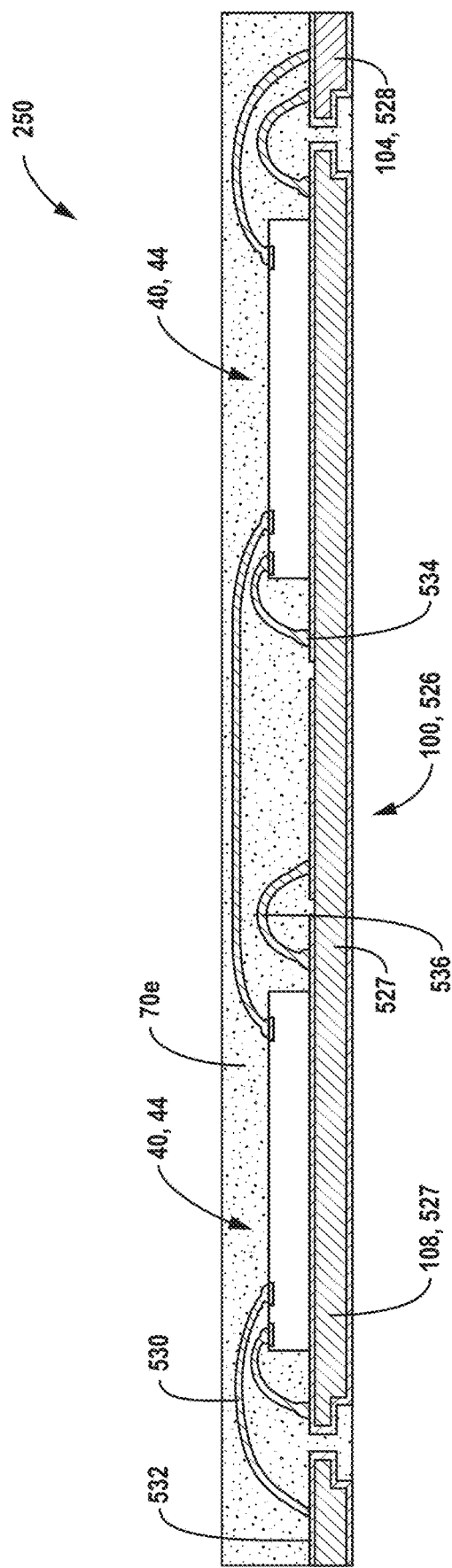
FIG. 8A illustrates a side view of an embodiment of an electronic assembly component comprising at least one wire bonded fan-out device, further comprising additional wire bonded components, coupled to the structural support of FIG. 6A, and electrically connected to each other and the structural support by wire bonds.

FIG. 8A, similar to FIG. 6A, illustrates an embodiment of an electronic assembly component 250 comprising at least one fan-out device 40, in which the molded fan-out device 40 is wire bonded to a leadframe 526 within the molded electronic assembly component 250, and further comprising at least one additional wire bonded element 44. The additional wire bonded element 44 may be another molded fan-out device 40, or a conventional chip or semiconductor die. Further illustrated are structural support pads 104, which in embodiments comprising the leadframe 526, correspond to bond leads 528 on the leadframe 526. Down bonds 534 and ground bonds 536 may also be a part of the package, as depicted.

FIG. 9A, similar to FIGS. 7A and 8A, shows an embodiment of an electronic assembly component 270 in which at least one molded fan-out device 40 is flip chip mounted to the leadframe 526, wherein the electronic assembly component 270 further comprises an additional flip-chip mounted element 46. The additional flip-chip mounted element 46 may be another molded fan-out device 40, or a conventional chip or semiconductor die. The fan-out device 40 may be coupled to the leadframe 526 by molded underfill 70*a*.

FIG. 10A, similar to FIGS. 8A and 9A, shows an embodiment of an electronic assembly component 290 in which both wirebonding and flip chip mounting of one or more molded fan-out devices 40 and other chips or semiconductor die may be coupled to a leadframe 526 as part of the electronic assembly component 290. The electronic assembly component 290 may further comprise additional flip-chip mounted elements 46 and additional wire bonded elements 44. The fan-out device 40 may be coupled to the leadframe 526 by molded underfill 70*a*.

FIG. 11 shows an embodiment of an electronic assembly component 310 where a portion (seen as feature of the structural support 100 comprising leadframe 526 is depressed. Bonding wire or wirebonds 530 are used to connect the depressed portion of the leadframe 526 to the portion of the leadframe that is not depressed. In some embodiments, Silver (Ag) plating may be used to improve the contact between the bonding wire 530 and the structural support pad 104, or bond lead 528 of leadframe 526.

As shown in FIGS. 6A, 7A, 8A, 9A, 10A and FIG. 11, the final electronic assemblies may be formed with a fan-out device 40 disposed within a leadframe package, corresponding to embodiments 210, 230, 250, 270, 290 and 310, respectively as described herein. The final leadframe package comprises a QFN package, DFN package, a SON package, a SOIC, a SOP, a SSOP, a TSOP, a TSSOP, a QFP, a PLCC, TQFP, a SOJ, a PDIP, a BGA package, or a LGA package, or other suitable package. Rather than merely having a standard chip or semiconductor die wirebonded to the leadframe, as is known in the art, FIGS. 6A, 7A, 8A, 9A, 10A and FIG. 11 illustrate a new arrangement in which the fan-out device 40 is used with the leadframe 526 and wirebonding rather than having the fan-out packaging replacing the wirebonding or leadframe as has been conventional in the art. FIGS. 7A, 9A and 10A further support a new arrangement in which the fan-out device 40 is used with the leadframe 526 and flip chip bonding.

FIGS. 6B, 7B, 8B, 9B, and 10B illustrate various embodiments in which a fan-out device 40 may be coupled to a structural support 100 which, in these embodiments, may comprise a laminate substrate 200, to form chip or chiplet-based fan-out electronic assembly components as part of a laminate package. The electronic assembly components of the immediately above-referenced figures (corresponding to embodiments 220, 240, 260, 280, and 300, respectively, as described further below) may comprise at least one fan-out device 40. The fan-out device 40 may comprise a first encapsulant 70 disposed around at least a memory device or function 10 and a processor device or function 20. A fan-out interconnect structure 80 may be disposed over the first encapsulant 70 of the fan-out device 40. In some embodiments, the fan-out interconnect structure 80 may comprise a molded direct contact interconnect structure 186 and in other embodiments, the fan-out interconnect structure may comprise a build-up interconnect structure 90 comprising PI. Input output pads 48 may be disposed over at least a portion of the fan-out interconnect structure 80. The electronic assembly components further comprise a structural support 100 comprising a laminate substrate 200. The laminate substrate 200 further comprises electrical routing 102 and structural support pads 104. In some embodiments, the structural support pads 104 comprise bond pads 206 as part of the laminate substrate 200. The structural support 100 further comprises at least one mounting site 108, where in those embodiments comprising a laminate substrate 200, the mounting site 108 is referred to as a laminate mount site 204 to which the fan-out device 40 may be coupled. In those embodiments comprising wire bond configurations, the fan-out device 40 may be coupled to laminate mount site 204 using a die attach adhesive, solder, or other materials and methods as known in the art. In other embodiments comprising flip chip configurations, the fan-out device 40 may be coupled electrically to the laminate mount site 204 using flip chip bumps 16 and coupled adhesively by a molded underfill 70*a* (as illustrated in FIGS. 7A, 7B, 9A and 9B). The input output pads 48 of the at least one fan-out device 40 may be electrically coupled by an electrical connector 106 to structural support pads 104, also referred to as bond pads 206 in embodiments comprising a laminate substrate 200. The electrical connector 106 may comprise a flip chip bump 16 or a wire bond 530. A second encapsulant or mold compound 70*e* may be disposed over at least a portion of the fan-out device 40 and the structural support 100 comprising a laminate substrate 200, as shown in FIGS. 6B, 7B, 8B, 9B, and 10B, following.

In the embodiments of FIGS. 6B, 7B, 8B, 9B, and 10A, the structural support may comprise a laminate substrate 200, as disclosed herein. The laminate substrate or PCB 200 may comprise any number of insulating and conducting layers as necessary to meet the routing requirements of the fan-out device 40. The laminate substrate 200 may in some embodiments comprise a high-density interconnect (HDI) substrate as known in the art and may include vias and/or plated through holes to allow interconnection between the conducting layers. The laminate substrate may be single sided, double sided or a multilayer substrate. In some embodiments, the laminate substrate 200 may comprise a buildup substrate, constructed by adding thin, non-reinforced polymer layers, such as epoxy layers (build-up layers) on both sides of a laminate core. The laminate core may be used for mechanical support and as a base to add the build-up layers on both sides. In other embodiments the substrate 200 may be formed as a coreless substrate using only build-up layers and no core layer. The laminate substrate 200 may comprise structural support pads 104 which may comprise layer 532 as described with reference to FIG. 6A above. The fan-out device 40 may comprise a die attach film (DAF) 109 disposed over a backside of the fan-out device 40, by which the fan-out device 40 is coupled to the laminate substrate 200.

Figure 6B:
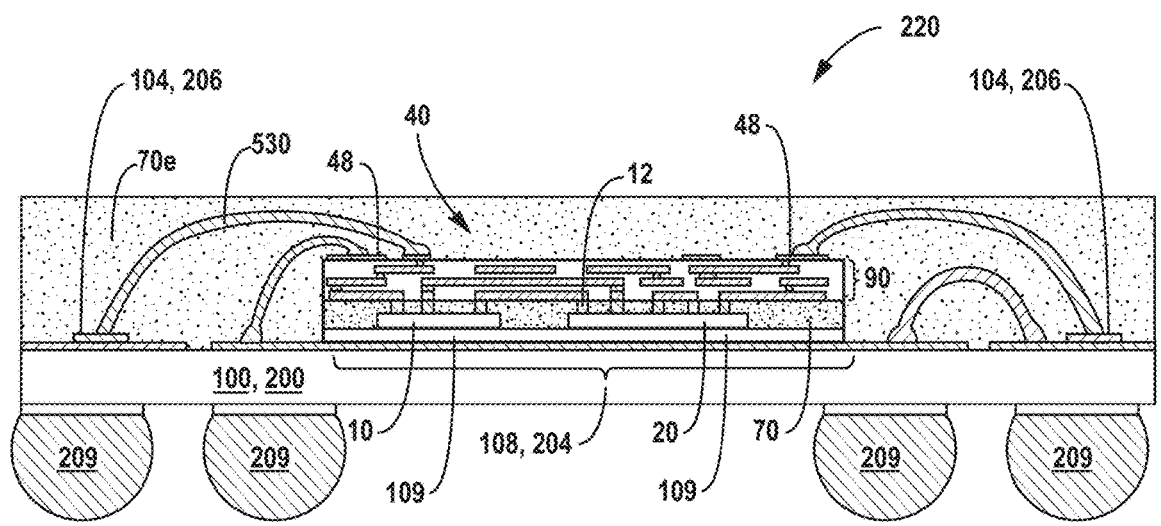
FIG. 6B illustrates a side view of the embodiment of the electronic assembly component of FIG. 6A, the fan-out device comprising a molded direct contact interconnect structure and coupled to a structural support comprising a laminate substrate, and electrically coupled by wirebonds.

FIG. 6B illustrates an electronic assembly component 220 similar to the embodiment 210 of FIG. 6A, comprising a structural support of the laminate substrate 200 as disclosed herein. FIG. 6B further illustrates the fan-out device 40 comprising a fan-out interconnect structure 80 comprising a molded direct contact interconnect structure 186. Further illustrated is mounting site 108, which in the laminate based embodiments of FIGS. 6B, 7B, 8B, 9B, and 10A comprises a laminate mount site 204, for coupling the fan-out device 40 to the structural support 100, or laminate substrate 200. Bond pads 104 of the structural support are further depicted, corresponding to bond pads 206 as part of the laminate substrate 200.

Figure 7B:
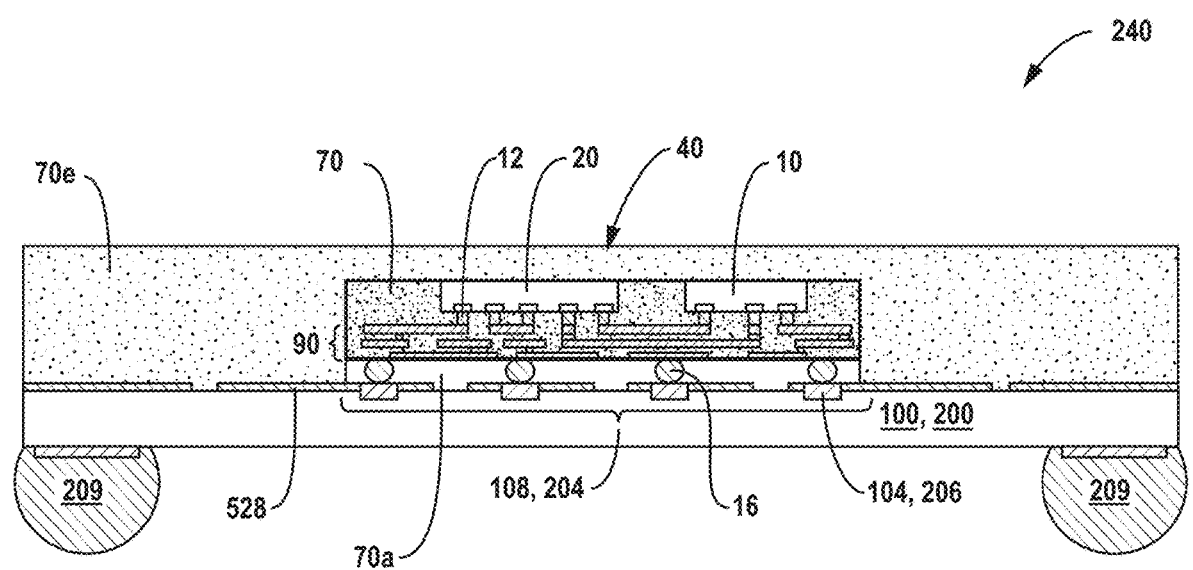
FIG. 7B illustrates a side view of an embodiment of the electronic assembly component of FIG. 7A, comprising a fan-out device comprising a memory device or function, a processor device or function, an analog device (not shown in this view) and a build-up interconnect structure, the fan-out device coupled to a structural support comprising a laminate substrate, and electrically connected by flip chip bumps. In some instances, the fan-out device 40 may be flip-chip attached to the structural support 100, such as the laminate substrate 200 (or other suitable substrate) with a second encapsulant 70e being omitted and only the underfill 70e being present as a "second encapsulant" that contacts at least a portion of the fan-out device 40.

FIG. 7B illustrates an electronic assembly component 240 comprising a flip chip mounted fan-out device 40, similar to the embodiment 230 of FIG. 7A, comprising a structural support 100 of the laminate substrate 200 as disclosed herein. The electronic assembly component 240 comprises multiple chips or chiplets 34 connected through conductive interconnects 12 to a build-up interconnect structure 90 comprising dielectric 64. The fan-out device 40 may be coupled to the laminate substrate 200 with one or more of a molded underfill 70*a* disposed between the fan-out device 40 and the laminate substrate 20, or with encapsulant 70*e* disposed between the fan-out device 40 and the laminate substrate 20.

Figure 8B:
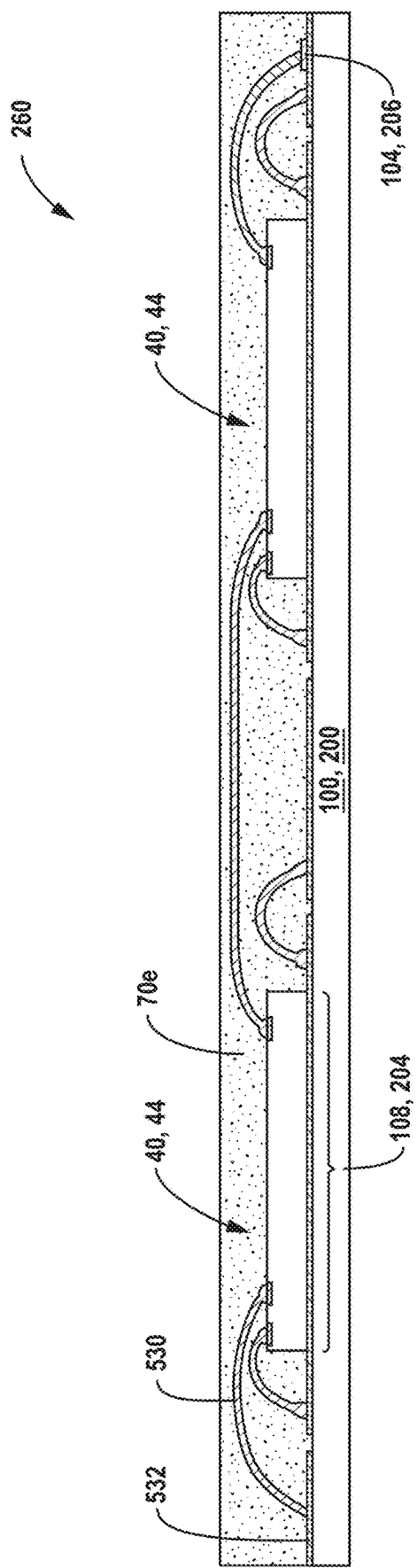
FIG. 8B illustrates a side view illustrating an embodiment of an electronic assembly component comprising at least one wire bonded fan-out device, further comprising additional wire bonded components, coupled to the laminate substrate structural support of FIG. 6B, and electrically connected to each other and the structural support by wire bonds.

FIG. 8B shows an embodiment of an electronic assembly component 260 similar to the embodiment 250 of FIG. 8A, comprising a structural support 100 of the laminate substrate 200 as disclosed herein. Further illustrated are structural support pads 104, which in embodiments comprising the laminate substrate 200, correspond to bond pads 206.

FIG. 9B depicts an embodiment of an electronic assembly component 280 similar to the embodiment 270 of FIG. 9A, comprising a structural support of the laminate substrate 200 as disclosed herein. Further illustrated are structural support pads 104, which in embodiments comprising the laminate substrate 200, correspond to bond pads 206 on the laminate substrate 200. Molded underfill 70*a* is shown disposed between the fan-out device 40 and the laminate substrate 200.

Figure 10B:
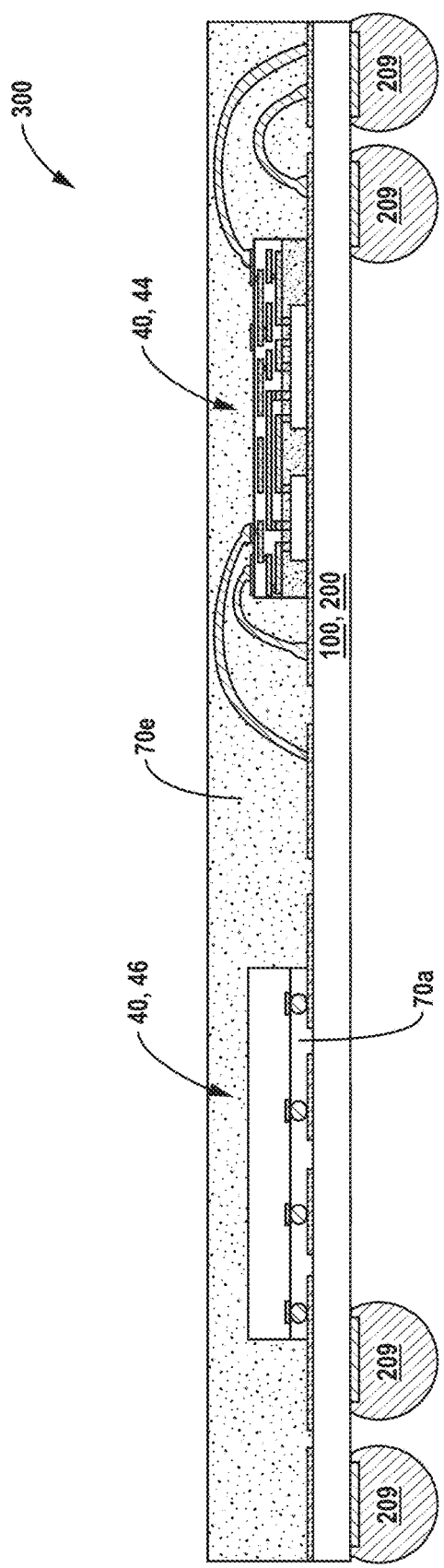
FIG. 10B illustrates a side view of an embodiment of an electronic assembly component comprising a structural support, one embodiment as shown in FIGS. 6B-9B, having disposed thereon: at least one fan-out device disposed face down and connected to the structural support by flip chip bumps, and at least one fan-out device disposed face up and connected to the structural support by wire bonds.

FIG. 10B depicts an embodiment of an electronic assembly component 300 similar to embodiment 290 of FIG. 10A, comprising a structural support 100 of the laminate substrate 200 as disclosed herein. As shown, additional of both wirebonded 44 and flip chip mounted 46 components may be included, as well as one or more molded fan-out devices 40 and other chips or semiconductor die may be coupled to the laminate substrate as part of the electronic assembly component 300.

The disclosure relates to methods of making a package, the method comprising providing a fan-out device comprising input output pads and further providing a structural support comprising electrical routing and structural support pads. The structural support may be a leadframe or a laminate substrate and may include at least one mounting site coupling the fan-out device to the mounting site on the leadframe, or to the mounting site of the laminate substrate. The method further comprises disposing encapsulant over the fan-out device, and singulating the encapsulated fan-out device to form the package.

In some embodiments, the method additionally comprises forming the input output pads (I/O Pads) as a plurality of wirebond pads wherein the wirebond pads are coupled to a fan-out interconnect structure for each of the plurality of fan-out devices; coupling first ends of a plurality of wirebonds to the plurality of wirebond pads; and coupling second ends of the plurality of wirebonds to portions of the leadframe. In other embodiments, second ends of the plurality of wirebonds may be coupled to portions of a laminate substrate as disclosed herein. I/O pads are intermediate structures that allow internal signals from an integrated circuit to travel externally such as through pins of a chip package.

In some embodiments, the method further comprises forming the input output pads (I/O Pads) as a plurality of flip chip pads wherein the plurality of flip chip pads are coupled to a fan-out interconnect structure for each of the plurality of fan-out devices, and flip chip mounting the plurality of fan-out devices to the plurality of mounting sites on the leadframe with a flip chip bump. In other embodiments, the method comprises flip chip mounting the plurality of fan-out devices to a plurality of mounting sites with a flip chip bump on a laminate substrate as disclosed herein.

The encapsulant can be deposited using a paste printing, compression molding, transfer molding, injection molding, liquid encapsulant molding, lamination, vacuum lamination, spin coating, or other suitable applicator. The encapsulant can be a polymer composite material, such as epoxy resin with filler, epoxy acrylate with filler, or polymer with proper filler.

Yet other embodiments comprise forming the input output pads as a plurality of flip chip pads; and flip chip mounting the plurality of fan-out devices to the plurality of mounting sites on the leadframe.

Certain embodiments further comprise depressing a portion of the leadframe to form a depressed portion of the leadframe; and disposing the encapsulant over the plurality of fan-out devices and around the depressed portion of the leadframe to form one or more exposed pads that are exposed with respect to the encapsulant at the exterior of the package.

In some embodiments the depressed portion of the leadframe forms a depressed die attach flag. In some embodiments, the fan-out device comprises a conductive heatsink or flag. The conductive heatsink or flag may be coupled to one or more exposed pad on the leadframe.

Some methods further comprise forming the fan-out interconnect structure with unit specific patterning over the chip or chiplet 34 to account for an actual position of the chip or chiplet 34.

Certain embodiments comprise a method wherein providing the fan-out device 40 comprising input output 48 pads further comprises: receiving a plurality of chips or chiplets 34 from different locations, the plurality of chip or chiplet 34 comprising: a processing function, and another function; forming a reconstituted panel 60 comprising a plurality of fan-out devices 40, comprising: providing a temporary carrier 50, forming a repeating array of the plurality of chips or chiplets 34 over the temporary carrier 50, disposing an encapsulant 70 over the temporary carrier 50 and over the repeating array of the plurality of chips or chiplets 34, forming a fan-out interconnect structure 80 over the encapsulant 70, interconnecting the chips or chiplets 34 to form a plurality of fan-out devices 40, and forming input output pads 48 coupled to the fan-out interconnect structure 80 for each of the plurality of fan-out devices 40; and singulating the reconstituted panel 60 to form the plurality of fan-out devices 40 comprising input output pads 48.

In some methods, the chip or chiplet 34 comprise a processing function further comprising a processor device or function 20, and in some methods the chip or chiplet 34 comprises another function such as one or more of an analog device, a memory device or function, a multiplier function, a clock, an AI accelerator, another IP package, an analog device, or a passive device.

In certain aspects, the disclosure concerns methods of making at least one electronic package, the method comprising receiving a plurality of chips or chiplets 34 from different sources, the plurality of chips or chiplets 34 comprising a processing function 20 and another function. A reconstituted panel 60 is formed comprising a plurality of fan-out devices 40, which is formed by providing a temporary carrier 50, forming a repeating array of the plurality of chips or chiplets 34 over the temporary carrier 50, disposing an encapsulant 70 over the temporary carrier 50 and over the repeating array of the plurality of chips or chiplets 34, forming a fan-out interconnect structure 80 over the encapsulant 70, interconnecting the chips or chiplets 34 to form a plurality of fan-out devices 40, and forming input output pads 48 coupled to the fan-out interconnect structure 80 for each of the plurality of fan-out devices 40. The reconstituted panel 60 may be singulated to form the plurality of fan-out devices 40 comprising input output pads 48. A leadframe 526 may be provided, the leadframe 526 comprising a plurality of mounting sites 527, and then mounting the plurality of fan-out devices 40 to the plurality of mounting sites 527 on the leadframe 526. Each of the plurality of fan-out devices 40 may be coupled to the leadframe 526 and the encapsulant 70 may be disposed over the plurality of fan-out devices 40 and the leadframe 527. The encapsulated plurality of fan-out devices 40 may be singulated to form the at least one electronic package.

When it is desired that the electronic packages comprise a structural support of a laminate substrate, the methods of making at least one electronic package comprise use of a laminate substrate, and the method as described above may be similarly performed using a laminate substrate 200 as disclosed herein, rather than a structural support 100 comprising one embodiment of a leadframe 526.

Consistent with the foregoing, fan-out packages are integrated circuit (IC) packages that are an enhancement of standard wafer-level packaging (WLP) solution and provide a chip scale (CS) or near CS package with routing to package input output interconnects that extends away from or "fan-out" from the chip or die. Wirebonding is an older technology that in many applications was replaced by denser packaging, like fan-out packaging. In many instances, flip chip packaging was similarly a way to avoid wirebonding and leadframes for higher input output (io) densities. Chips or chiplets have also been used as a way to increase density and decrease packaging cost, and have also been a step away from wirebonding.

The current approach shown and described herein provides a new arrangement of technological features for improved package. Advantages include improved system functionality, reduced cost, improvements in sourcing and supply chain logistics, improved yield, reduced cycle time, and a new ability to mix and match ideal silicon nodes with device needs. Cycle time can be improved from design to production by using existing chips, chiplets, or IP blocks and avoiding the time and expense of custom design, testing, and building of new IP blocks or new composite arraignments.

The current approach has applications for many devices, not only portable hand-held electronics, but automotive applications (e.g. control of electric windows), consumer appliances like washing machines, refrigerators, freezers, microwaves, dishwashers, and other devices.

Additional advantages include the ability to have the different chips or chiplets 34 sourced from different manufacturers, which allows flexibility to have certain more complex components made by higher tech manufactures while allowing cost flexibility on less stringent components. Cycle time can also be improved by allowing for use of existing chips, chiplets, or IP blocks. The instant process also allows for the ability to mix and match ideal silicon nodes with a desired device. For example, a wafer fab process that is designed to support both logic circuits and on-chip memory is a composite process that is not optimized for either the logic or memory circuits. Furthermore, memory circuits when manufactured as separate wafers are typically at a wafer fab node that is two or three generations less advanced than a state of the art logic wafer fab node. Through the use of logic and memory chiplets or separate logic and memory chips both devices can be optimally fabbed. The logic device can be fabbed in a wafer fab process optimized for logic devices (e.g., with high-k gate dielectrics and many layers of copper interconnects) at an advanced node such as 7 nm while the memory device or function can be fabbed in a wafer fab process optimized for memory devices or memory functions (e.g., with deep trench capacitors and only two or three interconnect layers) at a more relaxed node such as 20 nm. As such, the fan-out device 40 within the electronic assembly component may provide an improved solution by combining separate advantages into a single assembly.

While this disclosure includes a number of embodiments in different forms, there is presented in the drawings and written descriptions in the following pages detail of particular embodiments with the understanding that the present disclosure is to be considered as an exemplification of the principles of the disclosed methods and systems and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making at least one electronic assembly component, the method comprising:
   receiving a plurality of chiplet components from different sources, the plurality of chiplet components comprising at least one memory device or function and at least one processor device or function;
   forming a reconstituted panel comprising a plurality of fan-out devices, comprising:
      providing a temporary carrier,
      forming a repeating array of the plurality of chiplet components over the temporary carrier,
      disposing a first encapsulant over the temporary carrier and over and around the repeating array of the plurality of chiplet components,
      forming a fan-out interconnect structure over the repeating array of the plurality of chiplet components and the first encapsulant and,
      interconnecting the plurality of chiplet components to form a plurality of fan-out devices on the reconstituted panel,
      forming input output pads over the fan-out interconnect structure and coupled thereto for each of the plurality of fan-out devices, and
      singulating the reconstituted panel to form the plurality of fan-out devices comprising input output pads;
   providing a structural support comprising electrical routing, structural support pads and a plurality of mounting sites;
   mounting the plurality of fan-out devices to the plurality of mounting sites on the structural support;
   providing a plurality of electrical connectors configured to electrically couple the input output pads of the plurality of fan-out devices to the structural support pads;
   coupling, with the plurality of electrical connectors, each of the structural support pads with each of the input output pads of the plurality of fan-out devices;
   disposing a second encapsulant over or contacting the plurality of fan-out devices and the structural support; and
   singulating the plurality of fan-out devices and the structural support to form the at least one electronic assembly component.

2. The method of claim 1, wherein:
   the at least one memory device or function comprises non-volatile memory (NVM), dynamic random-access memory (DRAM), or static random-access memory (SRAM); and
   the at least one processor comprises a microcontroller unit (MCU), a central processing unit (CPU), a graphics processing unit (GPU), a field programmable gate array (FPGA), an application-specific integrated circuit (ASIC), a digital signal processor (DSP), an application processor (AP), a neural processing unit (NPU), or a network processor.

3. The method of claim 2, further comprising disposing, at least partially within the first encapsulant of the fan-out device, the at least one memory device or function, the at least one processor device or function, and at least one additional component comprising one or more of an analog device, a passive device, a transistor, a diode, an RF device, a multiplier function, a clock, an artificial intelligence (AI) accelerator, another IP function, and a chiplet.

4. The method of claim 1, comprising:
   forming the fan-out device as a molded direct contact interconnect structure or a build-up interconnect structure comprising a dielectric different than the encapsulant, such as a polymer or polyimide (PI).

5. The method of claim 1, wherein the structural support comprising electrical routing and structural support pads, further comprises:
   providing the structural support as a leadframe; and
   coupling the structural support pads of the leadframe to the input output pads of the fan-out device; or
   providing the structural support as a laminate substrate, ceramic substrate, glass core substrate, or a printed circuit board (PCB); and
   coupling the structural support pads of the laminate substrate or PCB to the input output pads of the fan-out device.

6. The method of claim 5, further comprising:
   coupling the structural support pads to the input output pads of the fan-out device with:
   wire bonds as the plurality of electrical connectors; or
   flip chip bumps as the plurality of electrical connectors.

7. The method of claim 6, further comprising forming external or package input output structures comprising one or more lands, balls, pads, leads, pins, and external interconnects.

8. The method of claim 7, further comprising:
   coupling the structural support pads to the input output pads of the fan-out device with:
   wire bonds as the plurality of electrical connectors; or
   flip chip bumps as the plurality of electrical connectors.

9. The method of claim 1, wherein the at least one electronic assembly component comprises a quad flat no-lead (QFN) package, dual flat no-lead (DFN) package, a small outline no-lead (SON) package, a small outline integrated circuit (SOIC), a small outline package (SOP), a shrink small outline package (SSOP), a small outline package (TSOP), a thin shrink small outline package (TSSOP), a quad flat package (QFP), thin quad flat pack (TQFP), plastic leaded chip carrier (PLCC), small outline J-lead package (SOJ), plastic dual-in-line package (PDIP), a ball grid array (BGA), a plastic BGA (PBGA), a fine pitch BGA (FBGA), a land grid array (LGA), a system in package (SIP), or a multi-chip module (MCM).

10. The method of claim 1, comprising:
    disposing the fan-out interconnect structure over the first encapsulant and coupled to conductive studs extending through the first encapsulant, and
    coupling the conductive studs to the at least one memory device or function and the at least one processor device or function.

11. The method of claim 1, comprising disposing the fan-out interconnect structure over the first encapsulant and coupled to the at least one memory device or function and the at least one processor device or function without conductive studs extending through the first encapsulant.

12. The method of claim 1, further comprising forming the fan-out interconnect structure with unit specific patterning over the plurality of chiplet components to account for an actual position of the plurality of chiplet components within the reconstituted panel.

13. The method of claim 1, wherein the plurality of chiplet components are laterally offset from one another and connected by the fan-out interconnect structure.

14. A method of making an electronic assembly component, the method comprising:
providing a fan-out device comprising at least two die and input output pads, wherein at least one side surface of each of the at least two die directly contacts a first encapsulant and each of the at least two die is coupled to a fan-out interconnect structure formed over the first encapsulant;
providing a leadframe comprising electrical routing and leadframe pads, the leadframe further comprising at least one mounting site configured to couple with the fan-out device;
mounting the fan-out device to the at least one mounting site on the leadframe;
wirebonding one or more of the input output pads of the fan-out device to the leadframe to create an electrical connection; and
disposing a second encapsulant over or contacting at least a portion of the fan-out device and the leadframe.

15. The method of claim 14, further comprising:
depressing a portion of the leadframe to form a depressed portion of the leadframe; and
disposing the second encapsulant around the depressed portion of the leadframe to form one or more exposed pads that are exposed with respect to the second encapsulant at an exterior of the electronic assembly component.

16. The method of claim 14, wherein the electronic assembly component comprises a quad flat no-lead (QFN) package, dual flat no-lead (DFN) package, a small outline no-lead (SON) package, a small outline integrated circuit (SOIC), a small outline package (SOP), a shrink small outline package (SSOP), a small outline package (TSOP), a thin shrink small outline package (TSSOP), a quad flat package (QFP), thin quad flat pack (TQFP), plastic leaded chip carrier (PLCC), small outline J-lead package (SOJ), plastic dual-in-line package (PDIP), a ball grid array (BGA), a plastic BGA (PBGA), a fine pitch BGA (FBGA), a land grid array (LGA), a system in package (SIP), or a multi-chip module (MCM).

17. The method of claim 14, further comprising disposing, at least partially within the first encapsulant of the fan-out device:
a memory device or function; and
a processor device or function.

18. The method of claim 17, further comprising disposing, at least partially within the first encapsulant of the fan-out device at least one additional component comprising one or more of analog device, a passive device, a transistor, a diode, an RF device, a multiplier function, a clock, an artificial intelligence (AI) accelerator, another IP function, and a chiplet disposed at least partially within the first encapsulant.

19. The method of claim 17, further comprising disposing at least a portion of the fan-out interconnect structure over the fan-out device and the fan-out device comprises unit specific patterning such that a misalignment between a via or conductive stump for an RDL of the fan-out device and the input output pads is less than a misalignment between an edge of the at least one fan-out device and the electrical connector of one or more of the memory device or function and the processor device or function.

20. The method of claim 17, comprising:
coupling the fan-out interconnect structure to conductive studs extending through the first encapsulant, and
coupling the conductive studs to the memory device or function and the processor device or function.

21. The method of claim 17, comprising:
coupling the fan-out interconnect structure to the memory device or function and the processor device or function without conductive studs extending through the first encapsulant.

22. The method of claim 14, wherein the electronic assembly component comprises a conductive heatsink or flag.

23. The method of claim 14, further comprising:
forming the fan-out device comprising a molded direct contact interconnect structure or comprising a build-up interconnect structure comprising a polymer, such as polyimide (PI).

24. The method of claim 14, wherein providing the leadframe comprising the electrical routing and the leadframe pads further comprises:
coupling the leadframe pads of the leadframe to the input output pads of the fan-out device.

25. The method of claim 14, further comprising forming external or package input output structures comprising one or more lands, balls, pads, leads, pins, and external interconnects.

26. The method of claim 24, further comprising:
coupling the leadframe pads to the input output pads of the fan-out device with wire bonds as the electrical connector; or
coupling the leadframe pads to the input output pads of the fan-out device with flip chip bumps as the electrical connector.

27. The method of claim 14, wherein the at least two die are laterally offset from one another and connected by a fan-out interconnect structure.

* * * * *